US005726524A

United States Patent [19]

Debe

[11] Patent Number: 5,726,524

[45] Date of Patent: Mar. 10, 1998

[54] FIELD EMISSION DEVICE HAVING NANOSTRUCTURED EMITTERS

[75] Inventor: Mark K. Debe, Stillwater, Minn.

[73] Assignee: Minnesota Mining and Manufacturing Company, St. Paul, Minn.

[21] Appl. No.: 656,573

[22] Filed: May 31, 1996

[51] Int. Cl.$^6$ .............................. H01J 1/30; C23C 16/00

[52] U.S. Cl. .......................... 313/309; 313/310; 313/336; 313/351; 313/495; 313/346 R; 427/255.6; 427/508; 427/521; 427/577; 427/578; 427/579; 427/249; 427/250; 427/255; 427/255.1; 204/192.1; 204/192.38

[58] Field of Search .................................... 313/309, 336, 313/351, 346 R, 495, 310; 427/58, 255.6, 255.7, 384, 376.1, 508, 521, 577, 578, 579, 249, 250, 255, 255.1; 204/298.02, 298.04, 192.38, 180.6, 192.1

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 3,969,545 | 7/1976 | Slocum | 427/163.1 |
| 4,209,008 | 6/1980 | Lemkey et al. | 427/283 |
| 4,252,843 | 2/1981 | Doer et al. | 427/162 |
| 4,252,865 | 2/1981 | Gilbert et al. | 427/164 |
| 4,338,164 | 7/1982 | Spohr | 204/4 |
| 4,340,276 | 7/1982 | Maffitt et al. | 204/192.27 |
| 4,396,643 | 8/1983 | Kuehn et al. | 427/160 |
| 4,568,598 | 2/1986 | Bilkadi et al. | 204/192.36 |
| 4,812,352 | 3/1989 | Debe | 428/142 |
| 5,039,561 | 8/1991 | Debe | 427/255.6 |
| 5,138,220 | 8/1992 | Kirkpatrick | 313/309 |
| 5,176,786 | 1/1993 | Debe | 156/600 |
| 5,238,729 | 8/1993 | Debe | 428/245 |
| 5,266,530 | 11/1993 | Bagley et al. | 437/228 |
| 5,336,558 | 8/1994 | Debe | 428/323 |
| 5,338,430 | 8/1994 | Parsonage et al. | 204/412 |
| 5,352,651 | 10/1994 | Debe et al. | 313/427 |
| 5,404,070 | 4/1995 | Tsai et al. | 313/336 X |
| 5,507,676 | 4/1996 | Taylor et al. | 445/50 |
| 5,508,584 | 4/1996 | Tsai et al. | 313/309 X |
| 5,578,901 | 11/1996 | Blanchet-Fincher et al. | 313/496 |
| 5,580,380 | 12/1996 | Liu et al. | 117/86 |
| 5,637,950 | 6/1997 | Jin et al. | 313/310 |

OTHER PUBLICATIONS

C.A. Spindt, I. Brodie, L. Humphrey, and E.R. Westerberg, *J. Appl. Phys.*, 47, 52–48 (1976).

C.A. Spindt, C.E. Holland, and R.D. Stowell, *Appl. Surf. Si.*, 16, 268 (1983).

deHeer, et al., "A Carbon Nanotube Field–Emission Electron Source," *Science* 270 Nov. 17, 1995, p. 1179.

Kirkpatrick, et al., "Demonstration of Vacuum Field Emission from a Self–Assembling Bimolecular microstructure Composite," *Appl. Phys. Lett.* 60(13), 30 Mar. 1992, pp. 1556–1558.

Technology News Item, *Solid State Technology*, Nov. 1995, p. 42.

Spallas, et al., "Field Emitter Array Mask Patterning Using Laser Interference Lithography", *Journal of Vacuum Science & Technology Part B*, vol. 13, No. 5, Sep. 1, 1995, pp. 1973–1978.

Zhirnov, et al., "Chemical Vapor Deposition and Plasma–Enhanced Chemical Vapor Deposition Carbonization of Silicon Microtips", *Journal of Vacuum Science & Technology Part B*, vol. 12, No. 2, Mar. 1, 1994, pp. 633–637.

*Primary Examiner*—Ashok Patel

*Attorney, Agent, or Firm*—Lorraine R. Sherman; Philip Y. Dahl

[57] ABSTRACT

An electric field emission device includes an electrode that includes a layer having a dense array of discrete, solid microstructures disposed on at least a portion of one or more surfaces of a substrate, the microstructures having an areal number density of greater than $10^7/cm^2$, the microstructures being individually conformally overcoated with one or more layers of an electron emitting material, the overcoated electron emitting material being disposed on at least a portion of the microstructures and have a surface morphology which is nanoscopically rough. A method for preparing the electrode used in the invention is discussed.

35 Claims, 12 Drawing Sheets

FIELD EMISSION DEVICE HAVING NANOSTRUCTURED EMITTERS

FIELD OF THE INVENTION

This invention relates to a field emission device including an electrode comprising a layer having a dense array of microstructures as electron emitters. The field emission devices can be two- or multi-electrode electron field emission flat panel displays and gas plasma flat panel displays, vacuum tubes for microwave devices, or other electron beam or ionization source devices.

BACKGROUND OF THE INVENTION

Flat panel displays are known in the art for electronically presenting graphs, symbols, alphanumerics, and video pictures. They replace conventional cathode-ray tubes, which have a large depth dimension, with a flat display that includes both active light-generating displays such as gas discharge (plasma), light-emitting diode, and field emission cathodoluminescence, and passive light-modulating displays such as liquid crystal devices.

Flat panel displays are typically matrix-addressed and they comprise matrix addressing electrodes. The intersection of each row line and each column line in the matrix defines a pixel, the smallest addressable element in an electronic display. The essence of electronic displays is the ability to turn on and off individual picture elements (pixels). A typical high information content display will have a quarter million pixels in a 33 cm diagonal orthogonal array, each under individual control by the electronics. The pixel resolution is normally just at or below the resolving power of the eye. Thus, a good quality picture can be created from a pattern of activated pixels.

One means for generating arrays of field emission cathode structures relies on well-established semiconductor microfabrication techniques. (U.S. Pat. Nos. 3,812,559, 3,755,704 3,665,241; C. A. Spindt, I. Brodie, L. Humphrey, and E. K. Westerberg, *J. Appl. Phys* 47, 5248 (1976); and C. A. Spindt; C. E. Holland, and R. D. Stowell, *Appl. Surf. Sci* 16, 268 (1983).) These techniques produce highly regular arrays of precisely shaped field emission tips. Lithography, generally used in these techniques, involves numerous processing steps, many of them wet. The number of tips per unit area, the size of the tips, and their spacings are determined by the available photoresists and the exposing radiation. Tips produced by the methods typically are cone-shaped with base diameters on the order of 0.5 to 1 μm, heights of anywhere from 0.5 to 2 μm, tip radii of tens of nanometers, and pitches on the order of 0.5 to 1 tips per micrometer. This size limits the number of tips per pixel possible for high resolution displays, where large numbers (400–1000 emitters per pixel) are desirable for uniform emission to provide adequate gray levels, and to reduce the current density per tip for stability and long lifetimes. Maintaining two dimensional registry of the periodic tip arrays over large areas, such as large TV-sized screens, can also be a problem for gated field emission constructions by Conventional means, resulting in poor yields and high costs.

U.S. Pat. No. 4,338,164 describes a method of preparing planar surfaces having microstructured protuberances thereon comprising a complicated series of steps involving irradiation of a soluble matrix (e.g., mica) with high energy ions, as from a heavy ion accelerator, to provide column-like traces in the matrix that are subsequently etched away to be later filled with an appropriate conductive, electron-emitting material. The original soluble matrix is then dissolved, following additional metal deposition steps that provide a conductive substrate for the electron-emitting material. The method is said to produce up to $10^6$ emitters per $cm^2$, the emitters having diameters of approximately 1–2 μm.

U.S. Pat. No. 5,138,220 describes an ungated field emission cathode construction comprising a metal-semiconductor eutectic composition such as a silicon-tantalum-disilicide or germanium-titanium-digermanicide eutectic. Etching of the majority component, e.g., silicon, reveals rod-like protuberances of, for example, tantalum disilicide having diameters of approximately 0.5 μm and areal density of $10^6$ rods per $cm^2$. The tips of the rods are further coated with both conducting (e.g., gold) and semiconducting (e.g., amorphous silicon) layers in order to produce a field emitting cathode.

U.S. Pat. No. 5,266,530 describes a gated electron field emitter prepared by a complicated series of deposition and etching steps on a substrate, preferably crystalline, polycrystalline or amorphous silicon. In one example, 14 deposition and etching steps are required to prepare an emitter material. The needle-like emitters are said to be about 1 μm high, but the patent is silent regarding needle diameter and areal density.

Other approaches include de Heer, et al., "A Carbon Nanotube Field-Emission Electron Source," *Science* 270 Nov. 17, 1995, p. 1179; Kirkpatrick et al., "Demonstration of Vacuum Field Emission from a Self-Assembling Biomolecular Microstructure Composite,", *Appl. Phys. Lett.* 60(13), 30 Mar. 1992, pp. 1556–1558; and Technology News item in *Solid State Technology*, November 1995, p. 42, which relates to vertical thin-film edge cylindrical field emitter.

Microstructured composite articles have been disclosed. See, for example, U.S. Pat. Nos. 4,812,352, 5,039,561, 5,176,786, 5,336,558; 5,338,436, and 5,238,729.

SUMMARY OF THE INVENTION

Briefly, the present invention provides an electron field emission display including an electrode comprising as cathode a layer comprising a dense array of discrete solid microstructures disposed on at least a portion of one or more surfaces of a substrate, the microstructures having an areal number density greater than $10^7/cm^2$, preferably greater than $10^8/cm^2$, and more preferably greater than $10^9/cm^2$, at least a portion of the microstructures being conformally overcoated with one or more layers of an electron emitting material, the overcoated electron emitting material being disposed on at least a portion of each of the microstructures and having a surface morphology that is nanoscopically rough with multiple potential field emission sites per microstructure. Preferably, the microstructures have an average cross-sectional dimension less than 0.3 micrometer, preferably less than 0.1 micrometer, and average lengths less than 10 micrometers, preferably less than 3 micrometers.

The display includes an electric field producing structure that comprises first and second conductive electrodes insulatingly spaced from and substantially parallel to each other, the first conductive electrode comprising a layer having a dense array of discrete solid micro structures disposed on at least a portion of one or more surfaces of a substrate, the microstructures having an areal number density greater than $10^7/cm^2$, at least a portion of the microstructures being conformally overcoated with one or more nanolayers of an electron emitting material, the overcoated electron emitting material being disposed on at least a portion of each of the microstructures and having a surface morphology that is nanoscopically rough to provide multiple potential field emission sites per microstructure.

In yet another aspect, the present invention provides a method of preparing a field emission electrode comprising the steps of:

providing a substrate bearing on at least one surface thereof a microlayer comprising a dense array of discrete, solid microstructures, the microstructures having an areal number density of greater than $10^7/cm^2$, preferably greater than $10^8/cm^2$, and more preferably greater than $10^9/cm^2$, and individually conformally overcoating at least a portion of the microstructures with one or more electronic emissive materials in an amount in the range of 10 to 1000 nm planar equivalent thickness, preferably 30 to 500 nm, and more preferably 50 to 300 nm planar equivalent thickness, by a process which produces said conformal overcoating with a surface morphology that is nanoscopically rough.

The process provides a plurality of potential electron emission sites on each overcoated microstructure and serves to decrease the effective work function of the electron emissive surface coating.

The discrete microstructures comprising the dense array can be uniformly, or preferably randomly, oriented. The microstructures can be rigid and straight, curled, curved, bent, or curvilinear. The spatial distribution may be a random or regular array.

The distribution of microstructures need not be uniform (i.e., the distribution of microstructures may be continuous or discontinuous). For example, the distribution of microstructures may form a pattern. The pattern may be repeating or non-repeating and can be formed by deposition of microstructure precursors through a mask, or by physical removal of microstructures by mechanical means or by light or laser ablation, or by encapsulation followed by delamination, or by replication of a patterned master.

Preferably, the microstructures have monocrystalline or polycrystalline regions.

Suitable microstructure materials include those that are stable in air and that can be formed into the microstructures and have low vacuum outgassing rates. Preferably, the microstructures comprise at least one of an inorganic material and an organic material.

Preferably, the microstructures comprise an organic material. Preferably, the molecules of the organic material are planar and comprise chains or rings, preferably rings, over which π-electron density (pi-electron density) is extensively delocalized. The most preferred organic materials can broadly be classified as polynuclear aromatic hydrocarbons and heterocyclic aromatic compounds. Organic pigments, such as perylene dicarboximide compounds, are particularly desirable.

A preferred method for making an electrode for a field emission display device of the present invention comprises the step of providing a matrix addressable substrate beating a microstructured layer, wherein the microstructured-layer comprises a dense array of discrete, solid, preferably elongated, uniformly or randomly oriented conformally overcoated microstructures. The discrete microstructures each are overcoated with at least one conformal coating of a material suitable for field emission or ionization such that the conformal coating at least partially individually overcoats each of a plurality of the microstructures to provide the electrode useful in the present invention.

More than one conformal coating may be present on each microstructure. Multiple conformal coatings which are electron emitting materials may have the same or different compositions. Multiple conformal coatings can comprise one or more layers which are not electron-emitting and which are not surface layers. Multiple conformal coatings can comprise materials selected to have gas pumping properties by gettering.

On each microstructure, a single conformal coating may be continuous or discontinuous. Preferably, a single conformal coating is continuous. If multiple conformal coatings are applied, each individual conformal coating may be continuous or discontinuous. Preferably, multiple conformal coatings collectively are continuous.

The surface of the conformal coating is nanoscopically rough. The coating comprises microcrystallites substantially covering the surface of the microstructures. These many microcrystallites contribute multiple emission sites due to their very high radii of curvature, large numbers, and low work functions generally associated with crystalline grain boundaries, steps, facets, kinks, ledges, and dislocations. The conformal coating may comprise crystalline and non-crystalline material. The surface morphology of the non-crystalline portions may also be nanoscopically rough. The roughness features may be in the range of 0.3 nm to 300 nm in any single dimension, preferably, 3 to 100 nm.

Preferred electron-emitting materials exhibit low electronic work functions, high thermal conductivity, high melting temperatures, negligible outgassing and tend to form nanoscopically rough coatings.

In this application:

"nanostructured layer" or "nanolayer" means a layer of nanometer scale average thickness which can be nanoscopically rough;

"nanoscopically rough coating" means surface features or film morphology (deviations from flatness, including projections and depressions) comprising a compositional inhomogeneity with a spatial scale on the order of nanometers in at least one dimension.

"microstructure" or "microstructured element" refers to individual units that are straight, curved, or curvilinear, and include units such as, for example, whiskers, rods, cones, pyramids, spheres, cylinders, laths, and the like;

"dense array" means microstructures in a closely spaced regular or random arrangement, wherein the mean spacing is typically in the range from about 1 nanometer to about 5000 nanometers, and preferably in the range from about 10 to about 1000 nanometers, and wherein preferably the mean spacing is approximately equal to the mean diameter of the microstructures;

"discrete microstructures" are independent and not fused one to another although they may be in contact with one another at one or more areas along their lengths;

"microstructures disposed on a substrate" means (a) microstructures totally exposed but adhered to a substrate and of a different material than the substrate, (b) microstructures partially exposed and partially encapsulated within a substrate and of a different material than the substrate, and/or (c) microstructures which are extensions of the substrate and of the same material as the substrate;

"microstructured layer" refers to a layer formed by all the microstructures taken together. An example of such a microstructured surface region with a spatial inhomogeneity in two dimensions is one comprised of elongated metal coated elements (microstructured elements) uniformly or randomly oriented on the surface of the substrate, with or without touching each other, with sufficient aspect ratio and numbers per unit area to achieve the desired properties. A two-dimensional spatially inhomogeneous microstructured surface region can be one such that translating through the region along any two of three orthogonal directions, at least two different materials will be observed, for example, the microstructured elements and voids;

"composite microstructures" refers to conformally coated microstructures;

"conformally coated" means a material is deposited onto at least a portion of at least one microstructure element and conforms to the shape of at least a portion of the microstructure element;

"uniformly oriented" means that at least 80 percent of the microstructures have angles between an imaginary line perpendicular to the surface of the substrate and the major axes that vary no more than approximately ±15° from the mean value of the aforementioned angles;

"randomly oriented" means not uniformly oriented;

"continuous" means coverage of a surface without interruption;

"discontinuous" means surface coverage that is periodic or aperiodic (such coverage for example, may involve individual microstructures, which have conformal coated and uncoated regions, or more than one microstructure, wherein one or more microstructures are coated and one or more adjacent microstructures are uncoated);

"solid" means not hollow;

"multiple" means at least two, preferably two or three;

"planar equivalent thickness" means the thickness of the coating if it were coated on a plane rather than distributed onto the microstructures;

"electronically emissive" means capable of emitting electrons by field or thermal emission;

"uniform" with respect to cross-section means that the major dimension of the cross-section of the individual microstructures varies no more than about 25 percent from the mean value of the major dimension, and the minor dimension of the cross-section of the individual microstructures varies no more than about 25 percent from the mean value of the minor dimension;

"uniform" with respect to length means that individual microstructures vary by no more than about 10 percent of the mean value of their lengths;

"stochastically uniform" means randomly formed by a probability-dependent process but, because of a large number of microstructures per unit area, there will be provided a uniform property of the microstructured layer;

"areal density" means the number of microstructures per unit area; and

"work function" of a uniform surface of an electronic conductor means the potential difference between the Fermi level (the electrochemical potential of the electrons inside the solid) and the near-surface vacuum level defined as the potential at the point at which the image force on an emitted electron has become negligible; in this invention work functions greater than zero and up to 6 eV can be desirable.

Advantageously, the present invention provides a field emission display including an electrode comprising very large numbers per unit area of extremely small, preferably elongated composite microstructures that can be applied to a wide variety of large area substrates by simple deposition processes and can be patterned by efficient dry processing methods.

Microstructured organic films of the present invention can be produced by a dry process and can be applied to any substrate of arbitrary size, capable of being heated in vacuum to approximately 260° C. The number of emitters per unit area can be as high as 30–40 per square micrometer, or over 1000 microstructures per 6 μm×6 μm pixel. In the present invention these high number densities of such ultra-small, nanoscopically rough, randomly arrayed, closely spaced microstructure elements give spatially averaged emission levels which are stochastically uniform from pixel to pixel at lower voltages than the prior art. Because of the large number of emitting sites per unit area, lower current densities per emission site are allowed. The microstructured electrodes of the present invention can be readily patterned by laser ablation or light ablation at arbitrary wavelengths. For example, with 17 micrometer spot sizes, patterning can be readily accomplished using a YAG laser with 1.2 watts on the sample plane and 3200 cm/sec sweep rate.

A summary article relating to flat panel display technology is presented in *Encyclopedia of Applied Physics,* Volume 5, VCH Publishers, Inc., New York, 1993, pp. 101–126. Electron field emission devices are known in the art. They are disclosed, for example, in U.S. Pat. Nos. 3,812,559, 5,404,070, 5,507,676, and 5,508,584, which are incorporated herein for structure and operation of such devices.

BRIEF DESCRIPTION OF THE DRAWING

FIG. 3(*b*) is a schematic showing incorporation of microstructured layers in electrodes in a matrix addressed gated field emission display device.

FIG. 5(*b*) shows a Fowler-Nordheim plot of the data of FIG. 5(*a*).

FIG. 6(*b*) is a Fowler-Nordheim plot of the data of plot B in FIG. 6(*a*).

DETAILED DESCRIPTION OF THE PREFERRED EMBODIMENTS

Figure 1:
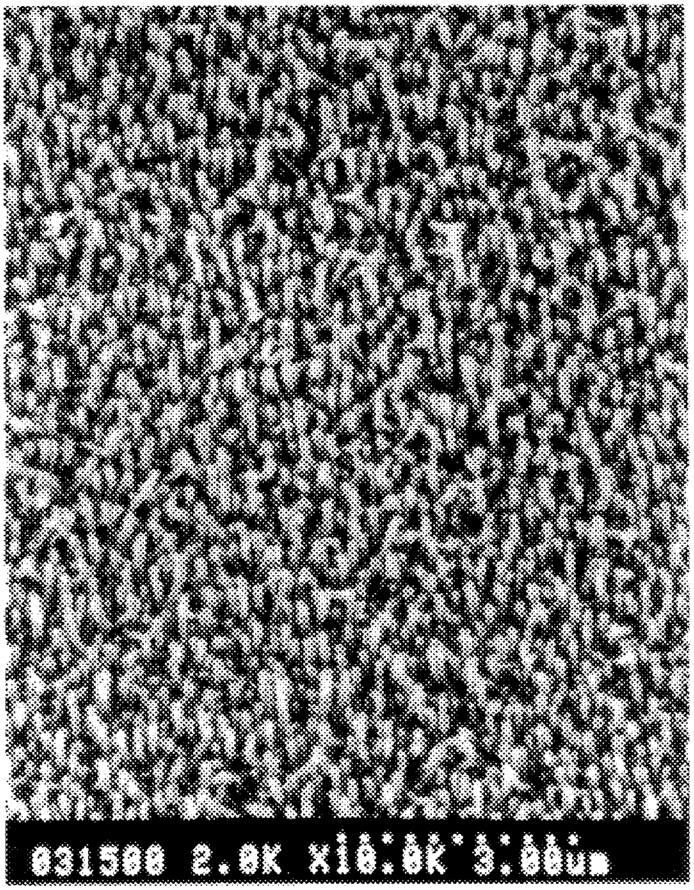
FIG. 1 shows a scanning electron micrograph taken at 10,000 X and a 45 degree viewing angle of a microstructured layer of an electrode of the present invention showing a typical areal density, spacing, and size of the composite microstructures.

It has been found that significant cold cathode vacuum tunneling field emission can be obtained at low applied electric fields from microstructured layers comprising, in a preferred embodiment, metal-coated organic pigment (e.g., C.I. PIGMENT RED 149 (perylene red)) whiskers. The microstructured films comprise a dense two-dimensional distribution of discrete, elongated crystalline whiskers having substantially uniform but not identical cross-sections, high length-to-width ratios, and, in further contrast to prior art, are non-identical and can be randomly arrayed and oriented. The whiskers are conformally coated with materials suitable for field emission or ionization, and which endow the whiskers with a fine nanoscopic surface structure capable of acting as multiple emission sites.

It has been discovered that even though the lengths, shapes, orientations, cross-sectional dimensions, and conformal coating roughness of the individual emitters are not identical and they may be randomly arrayed and oriented according to a stochastic growth process on a substrate, uniform emission as viewed over at least approximately 1–2 $cm^2$ dimensions on a phosphor screen can be obtained. It has also been observed that significant current densities, which obey a Fowler-Nordheim relation, can be obtained with emission thresholds of 5 to 10 volts per μm and factors of field enhancement per unit of gap distance of greater than $10^6$/cm. It is believed that the extremely large numbers per unit area of non-identical, but extremely small micro structures, as well as the nanometer scale roughness of the conformal field emitting coating, are responsible for the low threshold voltage, large field enhancements and the substantial uniformity of the spatially averaged emission.

The microstructured layer can be deposited on a substrate of any desired size by a totally dry process, and conveniently and rapidly patterned using, for example, high resolution (dry) laser ablation means.

Orientation of the microstructures is generally uniform in relation to the surface of the substrate. The microstructures are usually oriented normal to the original substrate surface, the surface normal direction being defined as that direction of the line perpendicular to an imaginary plane lying tangent to the local substrate surface at the point of contact of the base of the microstructure with the substrate surface. The surface normal direction is seen to follow the contours of the surface of the substrate. The major axes of the microstructures can be parallel or nonparallel to each other.

Alternatively, the microstructures can be nonuniform in shape, size, and orientation. For example, the tops of the microstructures can be bent, curled, or curved, or the microstructures can be bent, curled, or curved over their entire length.

Preferably, the microstructures are of uniform length and shape, and have uniform cross-sectional dimensions along their major axes. The preferred length of each microstructure is less than about 50 micrometers. More preferably, the length of each microstructure is in the range from about 0.1 to 5 micrometers, most preferably 0.1 to 3 micrometers. Within any microstructured layer it is preferable that the microstructures be of uniform length. Preferably, the average cross-sectional dimension of each microstructure is less than about 1 micrometer, more preferably 0.01 to 0.5 micrometer. Most preferably, the average cross-sectional dimension of each microstructure is in the range from 0.03 to 0.3 micrometer.

Preferably, the microstructures have an areal number density in the range from about $10^7$ to about $10^{11}$ microstructures per square centimeter. More preferably, the microstructures have an areal density in the range from about $10^8$ to about $10^{10}$ microstructures per square centimeter.

Microstructures can have a variety of orientations and straight and curved shapes, (e.g., whiskers, rods, cones, pyramids, spheres, cylinders, laths, and the like that can be twisted, curved, or straight), and any one layer can comprise a combination of orientations and shapes.

The microstructures have an aspect ratio (i.e., a length to diameter ratio) preferably in the range from about 1:1 to about 100:1).

A preferred method for making an organic-based microstructured layer is disclosed in U.S. Pat. Nos. 4,812,352 and 5,039,561, the disclosures of which are incorporated herein by reference. As disclosed therein, a method for making a microstructured layer comprises the steps of i) depositing a vapor of an organic material as a thin, continuous or discontinuous layer onto a substrate; and ii) annealing the deposited organic layer in a vacuum for a time and at a temperature sufficient to induce a physical change in the deposited organic layer to form a microstructured layer comprising a dense array of discrete microstructures but insufficient to cause the organic layer to evaporate or sublimate.

Materials useful as a substrate include those which maintain their integrity at the temperature and vacuum imposed upon them during the vapor deposition and annealing steps. The substrate can be flexible or rigid, planar or non-planar, convex, concave, textured, or combinations thereof.

Preferred substrate materials include organic materials and inorganic materials (including, for example, glasses, ceramics, metals, and semiconductors). The preferred substrate material is glass or metal.

Representative organic substrates include those that are stable at the annealing temperature, for example, polymers such as polyimide film (commercially available, for example, under the trade designation "KAPTON" from Du Pont Electronics of Wilmington, Del.), high temperature stable polyesters, polyamids, and polyaramids.

Metals useful as substrates include, for example, aluminum, cobalt, copper, molybdenum, nickel, platinum, tantalum, or combination thereof. Ceramics useful as a substrate material include, for example, metal or non-metal oxides such as alumina and silica. A particularly useful semiconductor is silicon.

Preferred methods for preparing a metal substrate include, for example, vacuum vapor depositing or ion sputter depositing a metal layer onto a polyimide sheet or web. Preferably, the thickness of the metal layer can be about 10 to 100 nanometers. Although not necessarily detrimental, exposure of the metal surface to an oxidizing atmosphere (e.g., air) may cause an oxide layer to form thereon.

The organic material from which the microstructures can be formed may be coated onto the substrate using techniques known in the art for applying a layer of an organic material onto a substrate, including, for example, vapor phase deposition (e.g., vacuum evaporation, sublimation, and chemical vapor deposition), and solution coating or dispersion coating (e.g., dip coating, spray coating, spin coating, blade or knife coating, bar coating, roll coating, and pour coating (i.e., pouring a liquid onto a surface and allowing the liquid to flow over the surface)). Preferably, the organic layer is applied by physical vacuum vapor deposition (i.e., sublimation of the organic material under an applied vacuum).

Useful organic materials for producing microstructures by, for example, coating followed by plasma etching, can include for example, polymers and prepolymers thereof (e.g., thermoplastic polymers such as, for example, alkyds, melamines, urea formaldehydes, diallyl phthalates, epoxies, phenolics, polyesters, and silicones; thermoset polymers, such as acrylonitrile-butadiene-styrenes, acetals, acrylics, cellulosics, chlorinated polyethers, ethylene-vinyl acetates, fluorocarbons, ionomers, nylons, parylenes, phenoxies, polyallomers, polyethylenes, polypropylenes, polyamide-imides, polyimides, polycarbonates, polyesters, polyphenylene oxides, polystyrenes, polysulfones, and vinyls); and organometallics (e.g., bis($\eta^5$-cyclopentadienyl)iron (II), iron pentacarbonyl, ruthenium pentacarbonyl, osmium pentacarbonyl, chromium hexacarbonyl, molybdenum hexacarbonyl, tungsten hexacarbonyl, and tris (triphenylphosphine) rhodium chloride).

Preferably, the chemical composition of the organic-based microstructured layer will be the same as that of the starting organic material. Organic materials useful in preparing the microstructured layer include, for example, planar molecules comprising chains or rings over which π-electron density is extensively delocalized. These organic materials generally crystallize in a herringbone configuration. Preferred organic materials can be broadly classified as polynuclear aromatic hydrocarbons and heterocyclic aromatic compounds.

Polynuclear aromatic hydrocarbons are described in Morrison and Boyd, *Organic Chemistry*, Third Edition, Allyn and Bacon, Inc. (Boston: 1974), Chapter 30. Heterocyclic aromatic compounds are described in Morrison and Boyd, supra, Chapter 31.

Preferred polynuclear aromatic hydrocarbons, which are commercially available, include, for example, naphthalenes, phenanthrenes, perylenes, anthracenes, coronenes, and pyrenes. A preferred polynuclear aromatic hydrocarbon is N,N'-di(3,5-xylyl)perylene-3,4,9,10 bis(dicarboximide) (commercially available under the trade designation "C. I. PIGMENT RED 149" from American Hoechst Corp. of Somerset, N.J.), herein designated "perylene red."

Preferred heterocyclic aromatic compounds, which are commercially available, include, for example, phthalocyanines, porphyrins, carbazoles, purines, and pterins. Representative examples of heterocyclic aromatic compounds include, for example, metal-free phthalocyanine (e.g., dihydrogen phthalocyanine) and its metal complexes (e.g. copper phthalocyanine).

The organic materials preferably are capable of forming a continuous layer when deposited onto a substrate. Preferably, the thickness of this continuous layer is in the range from 1 nanometer to about one thousand nanometers.

Orientation of the microstructures can be affected by the substrate temperature, the deposition rate, and angle of incidence during deposition of the organic layer. If the temperature of the substrate during deposition of the organic material is sufficiently high (i.e., above a critical substrate temperature which has been associated in the art with a value one-third the boiling point (K) of the organic material), the deposited organic material will form randomly oriented microstructures either as deposited or when subsequently annealed. If the temperature of the substrate during deposition is relatively low (i.e., below the critical substrate temperature), the deposited organic material tends to form uniformly oriented microstructures when annealed. For example, if uniformly oriented microstructures comprising perylene red are desired, the temperature of the substrate during the deposition of the perylene red is preferably about 0° to about 30° C. Certain subsequent conformal coating processes, such as DC magnetron sputtering and cathodic arc vacuum processes, produce curvilinear microstructures.

There can be an optimum maximum annealing temperature for different film thicknesses in order to fully convert the deposited layer to microstructures. When fully converted, the major dimension of each microstructure is directly proportional to the thickness of the initially deposited organic layer. Since the microstructures are discrete, are separated by distances on the order of their cross-sectional dimensions, and preferably have uniform cross-sectional dimensions, and all the original organic film material is converted to microstructures, conservation of mass implies that the lengths of the microstructures will be proportional to the thickness of the layer initially deposited. Due to this relationship of the original organic layer thickness to the lengths of the microstructures, and the independence of cross-sectional dimensions from length, the lengths and aspect ratios of the microstructures can be varied independently of their cross-sectional dimensions and areal densities. For example, it has been found that the length of microstructures are approximately ten times the thickness of the vapor deposited perylene red layer, when the thickness ranges from about 0.05 to about 0.2 micrometer. The surface area of the microstructured layer (i.e., the sum of the surface areas of the individual microstructures) is much greater than that of the organic layer initially deposited on the substrate. Preferably, thickness of the initially deposited layer is in the range from about 0.05 to about 0.25 micrometer.

Each individual microstructure can be monocrystalline or polycrystalline, rather than amorphous. The microstructured layer can have highly anisotropic properties due to the crystalline nature and uniform orientation of the microstructures.

If a discontinuous distribution of microstructures is desired, masks may be used in the organic layer deposition step to selectively coat specific areas or regions of the substrate. A discontinuous distribution of microstructures may also be obtained by coating (e.g., sputter coating, vapor coating, or chemical vapor depositing) a layer of metal (e.g., Au, Ag, and Pt) onto the organic layer prior to the annealing step. Areas of the organic layer having the metal coating thereon generally do not convert to the microstructures during the annealing step. Preferably, the planar equivalent thickness of the metal coating, which can be discontinuous, is in the range from about 0.1 to about 500 nanometers.

Other techniques known in the art for selectively depositing an organic layer on specific areas or regions of a substrate may also be useful.

In the annealing step, the substrate having an organic layer coated thereon is heated in a vacuum for a time and at a temperature sufficient for the coated organic layer to undergo a physical change, wherein the organic layer grows to form a microstructured layer comprising a dense array of discrete, oriented monocrystalline or polycrystalline microstructures. Uniform orientation of the microstructures is an inherent consequence of the annealing process when the substrate temperature during deposition is sufficiently low. Exposure of the coated substrate to the atmosphere prior to the annealing step is not observed to be detrimental to subsequent microstructure formation.

If, for example, the coated organic material is perylene red or copper phthalocyanine, annealing is preferably done in a vacuum (i.e., less than about $1\times10^{-3}$ Torr) at a temperature in the range from about 160° to about 270° C. The annealing time necessary to convert the original organic layer to the microstructured layer is dependent on the annealing temperature. Typically, an annealing time in the range from about 10 minutes to about 6 hours is sufficient. Preferably the annealing time is in the range from about 20 minutes to about 4 hours. Further, for perylene red, the optimum annealing temperature to convert all of the original organic layer to a microstructured layer, but not sublime it away, is observed to vary with the deposited layer thickness. Typically, for original organic layer thicknesses of 0.05 to 0.15 micrometer, the temperature is in the range of 245° to 270° C.

The time interval between the vapor deposition step and the annealing step can vary from several minutes to several months, with no significant adverse effect, provided the coated composite is stored in a covered container to minimize contamination (e.g., dust). As the microstructures grow, the organic infrared band intensities change and the laser specular reflectivity drops, allowing the conversion to be carefully monitored, for example, in situ by surface infrared spectroscopy. After the microstructures have grown to the desired dimensions, the resulting layered structure, which comprises the substrate and the microstructures, is allowed to cool before being brought to atmospheric pressure.

If a patterned distribution of microstructures is desired, microstructures may be selectively removed from the substrate, for example, by mechanical means, vacuum process means, chemical means, gas pressure or fluid means, radiation means, and combinations thereof. Useful mechanical means include, for example, scraping microstructures off the substrate with a sharp instrument (e.g., with a razor blade), and encapsulating with a polymer followed by delamination. Useful radiation means include laser or light ablation. Such ablation can result in a patterned cathode. Useful chemical means include, for example, acid etching selected areas or regions of the microstructured layer. Useful vacuum means include, for example, ion sputtering and reactive ion etching. Useful air pressure means include, for example, blowing the microstructures off the substrate with a gas (e.g., air) or fluid stream. Combinations of the above are also possible, such as use of photoresists and photolithography.

The microstructures can be partially exposed and partially encapsulated within a final substrate, and of a different material than the final substrate, by first forming the microstructures on a temporary substrate, then pressing the microstructures partially into the surface of the final substrate (for example, by hot roll calendering as described in U.S. Pat. No. 5,352,651, Example 34) and removing the temporary substrate.

The microstructures can be extensions of the substrate and of the same material as the substrate by, e.g., vapor depositing a discontinuous metal microisland mask onto the surface of a polymer, then plasma or reactive ion etching away the polymer material not masked by the metal microislands, to leave polymer substrate posts protruding from the surface.

Other methods for making microstructured layers are known in the art. For example, methods for making organic microstructured layers are disclosed in *Materials Science and Engineering*, A158 (1992), pp. 1–6; *J. Vac. Sci. Technol.* A, 5, (4), July/August, 1987, pp. 1914–16; *J. Vac. Sci. Technol.* A 6, (3), May/August, 1988, pp. 1907–11; *Thin Solid Films.*, 186, 1990, pp. 327–47; *J. Mat. Sci..*, 25, 1990, pp. 5257–68; *Rapidly Ouenched Metals*, Proc. of the Fifth Int. Conf. on Rapidly Quenched Metals, Wurzburg, Germany (Sep. 3–7, 1984), S. Steeb et at., eds., Elsevier Science Publishers B.V., New York, (1985), pp. 1117–24; *Photo. Sci. and Eng.*, 24, (4), July/August, 1980, pp. 211–16; and U.S. Pat. Nos. 4,568,598 and 4,340,276, the disclosures of which patents are incorporated herein by reference. Methods for making inorganic-based microstructured layers of whiskers are disclosed, for example, in *J. Vac. Sci. Tech. A*, 1, (3), July/Sept., 1983, pp. 1398–1402 and U.S. Pat. No. 3,969,545; U.S. Pat. Nos. 4,252,865, 4,396,643, 4,148,294, 4,252,843, 4,155,781, 4,209,008, and 5,138,220, the disclosures of which patents are incorporated herein by reference.

Useful inorganic materials for producing microstructures include, for example, carbon, diamond-like carbon, ceramics (e.g., metal or non-metal oxides such as alumina, silica, iron oxide, and copper oxide; metal or non-metal nitrides such as silicon nitride and titanium nitride; and metal or non-metal carbides such as silicon carbide; metal or non-metal borides such as titanium boride); metal or non-metal sulfides such as cadmium sulfide and zinc sulfide; metal silicides such as magnesium silicide, calcium silicide, and iron silicide; metals (e.g., noble metals such as gold, silver, platinum, osmium, iridium, palladium, ruthenium, rhodium, and combinations thereof, transition metals such as scandium, vanadium, chromium, manganese, cobalt, nickel, copper, zirconium, and combinations thereof; low melting metals such as bismuth, lead, indium, antimony, tin, zinc, and aluminum; refractory metals such as tungsten, rhenium, tantalum, molybdenum, and combinations thereof); and semiconductor materials (e.g., diamond, germanium, selenium, arsenic, silicon, tellurium, gallium arsenide, gallium antimonide, gallium phosphide, aluminum antimonide, indium antimonide, indium tin oxide, zinc antimonide, indium phosphide, aluminum gallium arsenide, zinc telluride, and combinations thereof).

Figure 8:
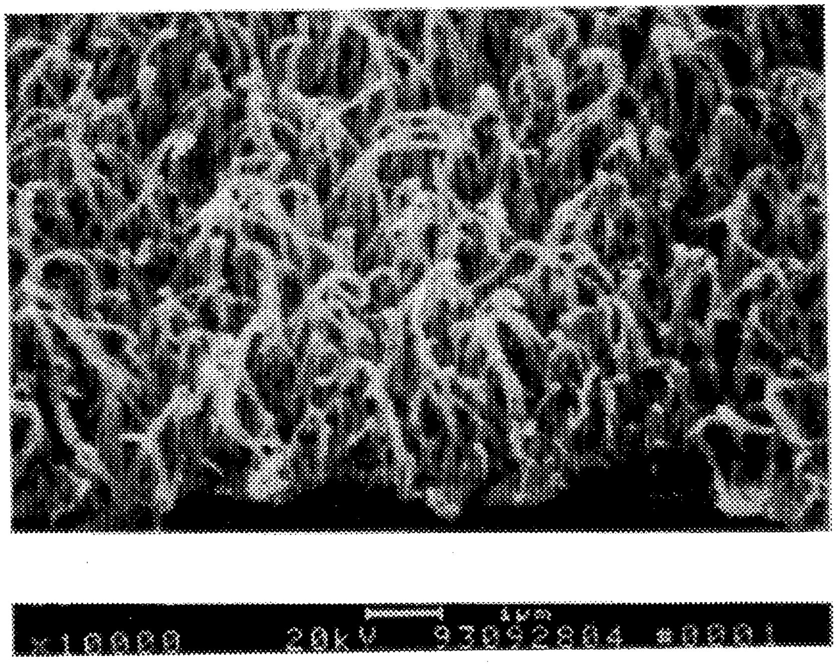
FIG. 8 shows an SEM at 10,000 X of curvilinear microstructures with a diamond-like carbon coating used in Example 12.

The microstructures of the preferred embodiment can be made to have random orientations by control of the substrate temperature during the deposition of the initial PR149 layer, as described above. They can also be made to have curvilinear shapes by conditions of the conformal coating process. As discussed in FIG. 6 of L. Aleksandrov, "GROWTH OF CRYSTALLINE SEMICONDUCTOR MATERIALS ON CRYSTAL SURFACES," Chapter 1, Elsevier, New York, 1984, the energies of the arriving atoms applied by different coating methods, e.g., thermal evaporation deposition, ion deposition, sputtering and implantation, can range over 5 orders of magnitude. The higher energy processes can cause the PR149 whiskers to deform during the conformal coating process, such as shown in FIG. 8 of the invention Drawing. This effect can be an advantage for field emission from microstructures having multiple potential emission sites on their surfaces in the form of nanoscopically rough features, since as the tips curl over, more of the potential emission sites will be positioned appropriately for field emission towards a cathode.

It is within the scope of the present invention to modify the methods for making a microstructured layer to make a discontinuous distribution of microstructures.

Preferably, the one or more layers of conformal coating material, if applied, serve as a functional layer imparting desirable electronic properties such as conductivity and electronic work function, also properties such as thermal properties, optical properties, for example, light absorbing for ablation, mechanical properties (e.g., strengthens the microstructures comprising the microstructured layer), chemical properties (e.g., provides a protective layer), and low vapor pressure properties.

A further function of the conformal coating can be to provide a high surface area vacuum gettering material for continuous pumping away of gases which can evolve by outgassing and permeation to degrade the vacuum quality within the flat panel display device. Examples of coating materials with vacuum gettering properties include Zr-V-Fe and Ti.

The conformal coating material preferably can be an inorganic material or it can be an organic material including a polymeric material. Useful inorganic and organic conformal coating materials include, for example, those described above in the description of the microstructures. Useful organic materials also include, for example, conductive polymers (e.g., polyacetylene), polymers derived from poly-p-xylylene, and materials capable of forming self-assembled layers.

The preferred thickness of the conformal coating is typically in the range from about 0.2 to about 50 nm, depending on the electron emission application.

The conformal coating may be deposited onto the microstructured layer using conventional techniques, including, for example, those disclosed in U.S. Pat. Nos. 4,812,352 and 5,039,561, the disclosures of which are incorporated herein by reference. Any method that avoids disturbance of the microstructured layer by mechanical forces can be used to deposit the conformal coating. Suitable methods include, for example, vapor phase deposition (e.g., vacuum evaporation, sputter coating, and chemical vapor deposition) solution coating or dispersion coating (e.g., dip coating, spray coating, spin coating, pour coating (i.e., pouring a liquid over a surface and allowing the liquid to flow over the microstructured layer, followed by solvent removal)), immersion coating (i.e., immersing the microstructured layer in a solution for a time sufficient to allow the layer to adsorb molecules from the solution, or colloidals or other particles from a dispersion), electroplating and electroless plating. More preferably, the conformal coating is deposited by vapor phase deposition methods, such as, for example, ion sputter deposition, cathodic arc deposition, vapor condensation, vacuum sublimation, physical vapor transport, chemical vapor transport, and metalorganic chemical vapor deposition. Preferably, the conformal coating material is a metal or a low work function material such as diamond-like carbon.

For the deposition of a patterned conformal coating, the deposition techniques are modified as is known in the art to produce such discontinuous coatings. Known modifications include, for example, use of masks, shutters, directed ion beams, and deposition source beams.

The nanometer scale roughness of the electron emissive conformal coating on the microstructure elements is an important aspect of the present invention. The morphology of this coating is generally determined by the coating process and the surface characteristics of the microstructure elements. For example, for the preferred coating process of vacuum deposition of metals onto the PR149 microstructure, the conformal coating morphology is determined first by the way the specific coating material nucleates into islands of nanometer scale average largest dimension on the sides of the crystalline whiskers, and subsequently how the coating develops from those initial nucleation sites. This nucleation and growth can be determined by the choice of vacuum coating method, e.g., physical vapor deposition or sputter deposition, the deposition rates and incidence angles chosen for either process, the substrate temperature and background gas pressures during deposition, and the like. H. J. Leamy et al., "The Microstructure of Vapor Deposited Thin Films", CURRENT TOPICS IN MATERIALS SCIENCE, vol. 6, Chapter 4, North-Holland Publishing Company, 1980; J. P. Hirth et al. "Nucleation Processes in Thin Film Formation", PHYSICS OF THIN FILMS, vol. 4, Academic Press, New York, 1967; and L. Aleksandrov, GROWTH OF CRYSTALLINE SEMICONDUCTOR MATERIALS ON CRYSTAL SURFACES, Chapter 1, Elsevier, New York, 1984, describe such nucleation and growth mechanisms in more detail.

The nanoscopic scale roughness can also be affected by the presence of impurities or intentional dopants applied to the surfaces of the microstructure elements, and by preprocessing steps such as plasma etching of the microstructure elements before deposition of the conformal coating.

The morphology can also be affected when the conditions are met for epitaxial growth of the coating material onto crystalline microstructures. See, e.g., U.S. Pat. No. 5,176,786, which is incorporated herein by reference for these teachings, and J. H. van der Merwe, "Recent Developments in the Theory of Epitaxy", CHEMISTRY AND PHYSICS OF SOLID SURFACES, Springer-Verlag, New York, 1984.

Figure 2A:
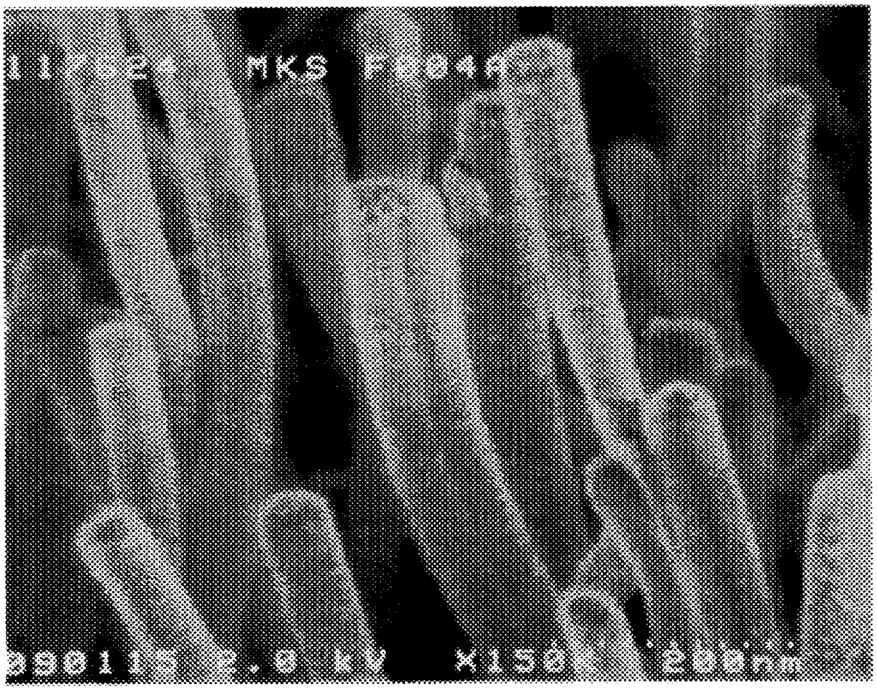
FIGS. 2(*a–c*) show SEM micrographs at 150,000 X of composite microstructures in electrodes of the invention, illustrating variation of the nanoscopic roughness of the conformal coating and size of the microstructures with amount of metal coated onto the microstructures.
Figure 2B:
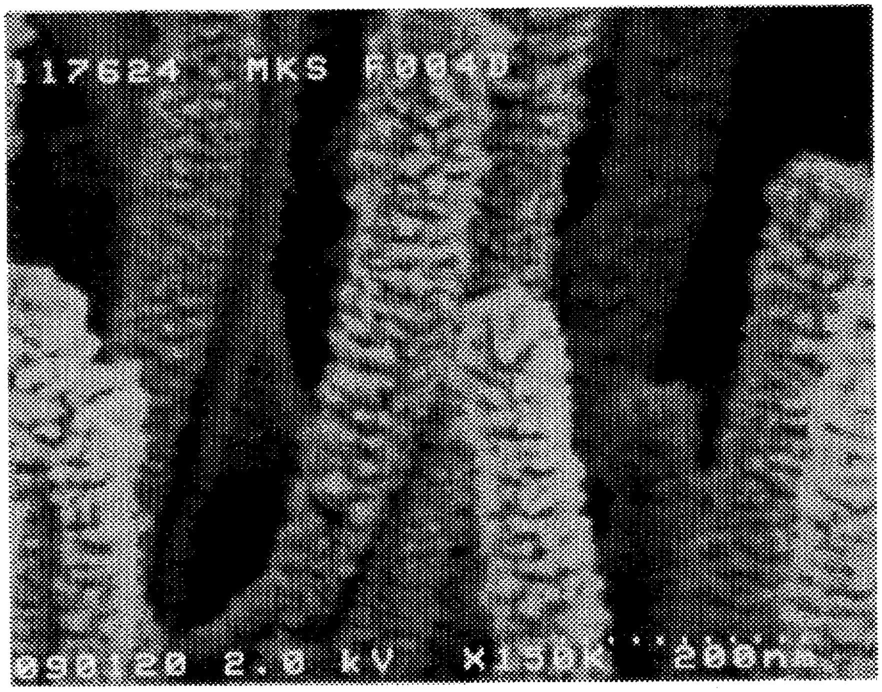
Figure 2C:
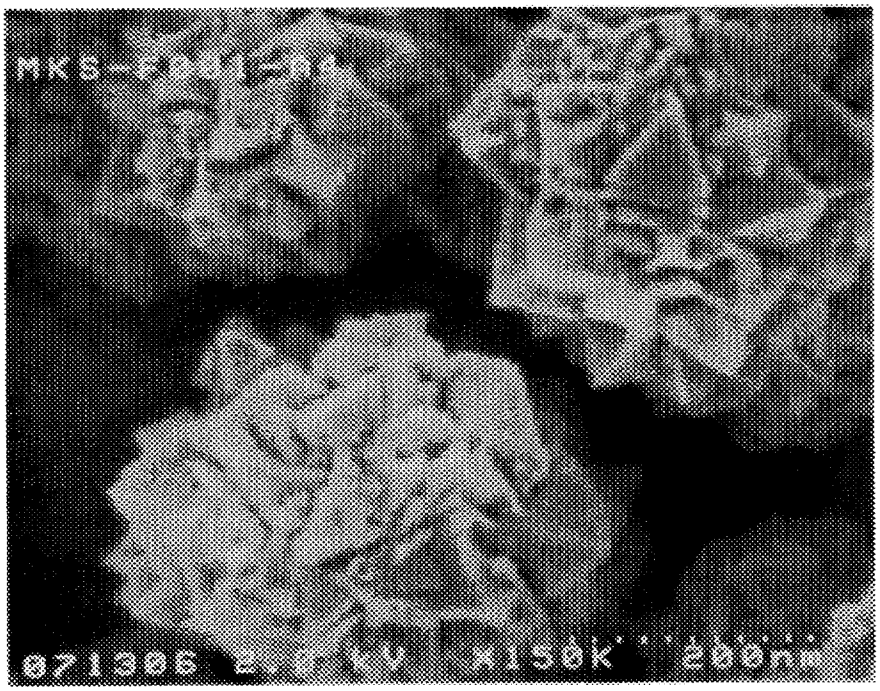

Shadowing, by the microstructures themselves, of the vapor depositing material will also influence the roughness of the conformal coating and its distribution along the lengths of the microstructures. The effect will generally be to cause the tops of oriented microstructures to become preferentially coated at the expense of their bases, as illustrated in FIGS. 2(*a*) to 2(*c*) and discussed in A. G. Dirks et al., "Columnar Microstructure in Vapor-Deposited Thin Films", THIN SOLID FILMS, 47, pp. 219–233.

The ultimate size of the roughness features deriving from this nucleation and growth can be further strongly determined by the total amounts of the conformal coating material applied. This is illustrated in FIGS. 2(*a–c*).

FIG. 2(*a*) shows microstructures that have been coated with 0.054 mg/cm$^2$ of Pt, FIG. 2(*b*) with 0.22 mg/cm$^2$ of Pt and FIG. 2(*c*) with 0.86 mg/cm$^2$ of Pt. FIG. 2(*b*) shows the sides of the microstructures are densely covered with sharp, angular crystallites, with overall dimensions of 20 nm or less. The near normal incidence view of the tops of the heavily coated microstructures in FIG. 2(*c*) shows nanometer sized crystalline platelets of Pt. The widths of the tips in FIG. 2(*c*) are much larger than their bases as a result of the shadowing effect described above. The nanoscopic crystallites in FIGS. 2(*a–c*) are characterized by edges having atomic scale radii of curvature, and multiple facets and grain boundaries and other potentially low work function sites, all features conducive to enhanced electron field emission.

Figure 3A:
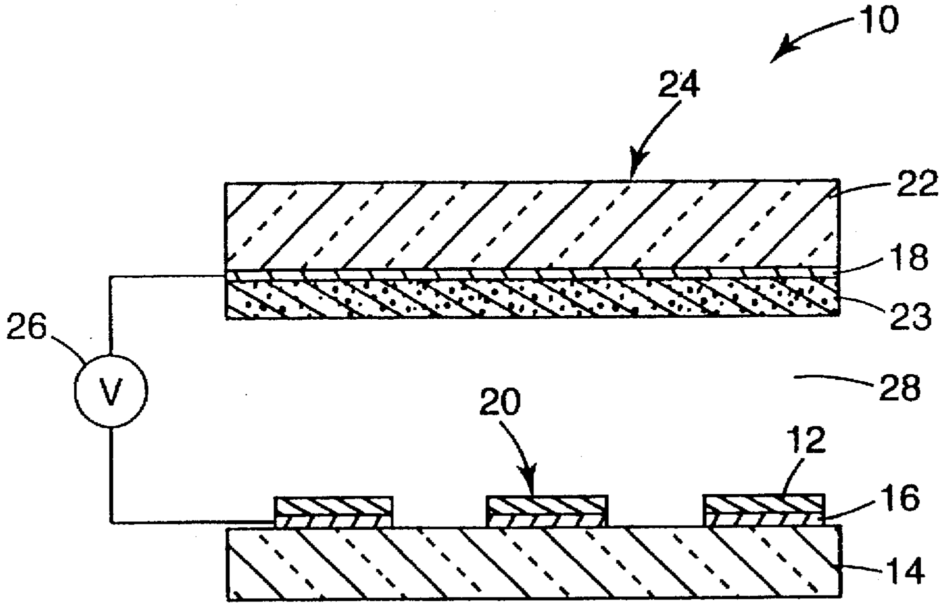
FIG. 3(*a*) is a schematic showing incorporation of microstructured layers in electrodes in a matrix addressed vacuum, gas plasma, or ungated field emission display device, for example, as in Examples 5–15.
Figure 3B:
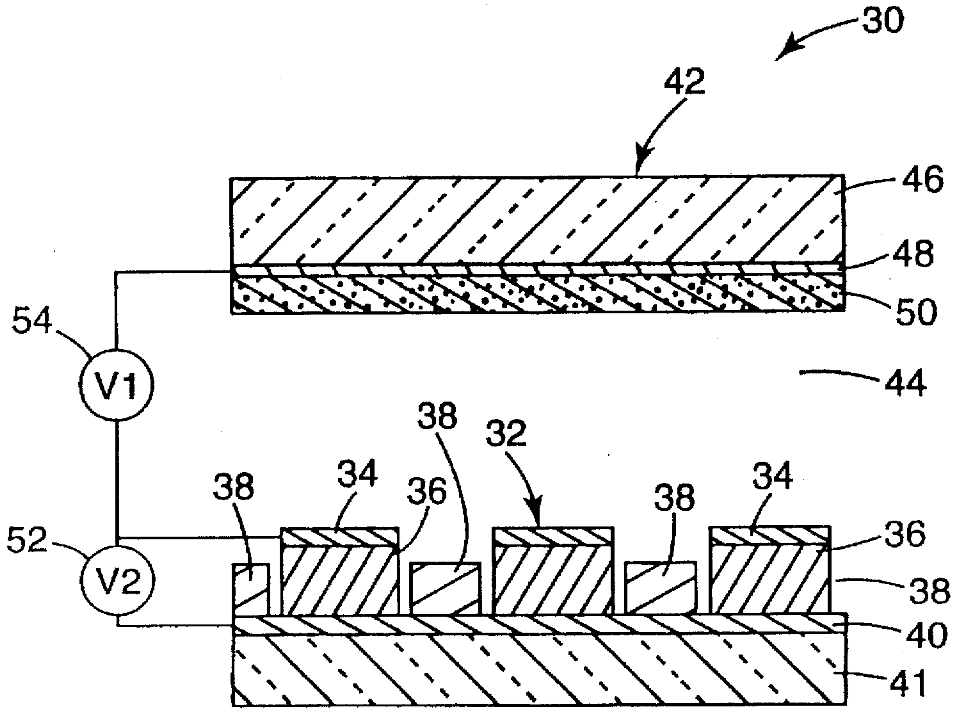

FIG. 3(*a*) shows a schematic (cross-sectional view) of a portion of the components for a matrix addressed gas plasma or ungated field emission display device 10 including cathode 20, for one embodiment of the invention. Patterned microstructured layer 12 disposed on row conductors 16 which are supported by substrate 14 provides cathode 20. Transparent column conductors 18, generally indium tin oxide (ITO), are disposed on substrate 22, preferably glass, which supports a layer of continuous or discontinuous phosphor material 23 and which comprises anode 24 of the invention. Phosphor material 23 is capable of excitation by electrons. Upon applying a voltage from voltage source 26, there results a high electric field being applied to the emission sites of microstructured layer 12. This causes a flow of electrons across low pressure gas or vacuum gap 28 between column conductors 18 and row conductors 16. Gap 28 which is the space between phosphor 23 and cathode 20 can have a vertical dimension of about 1 μm to several mm. Electrons accelerated by the voltage across gap 28 impinge upon phosphor containing layer 23, resulting in light emission, as is known in the art.

FIG. 3(*b*) shows a schematic (cross-sectional view) of a portion of the components for one embodiment of a matrix addressed gated field emission display device 30. The device includes gated cathode 32 which includes conductive gate columns 34, insulated spacers 36 having a height in the range of 0.5 to 20 μm, patterned microstructured layer 38, deposited on and in electrical contact with row conductors 40 which are supported on substrate 41, generally glass. Cathode 32 is spaced apart from anode 42 by low pressure gas or preferably vacuum gap 44, the space between phosphor 50 and cathode 32, that can have a vertical dimension in the range of about 1 μm to 5 mm. Anode 42 comprises substrate 46, generally glass, on which is located transparent, continuous or discontinuous ITO layer 48 which supports continuous or discontinuous phosphor containing layer 50 as is known in the art. In one operational mode, voltage from voltage source 52 applied between conductive gate columns 34 and row conductors 40 results in a high electric field being applied to microstructured layer 38, and subsequent field emission of electrons into gap 44. Voltage from voltage source 54 accelerates the field emitted electrons across gap 44, resulting in light emission after collision of electrons with phosphor layer 50. Preferably the height of microstructured layers 38 is the same as or less than the height of cathode 32. In a second operational mode, the voltage from source 54 can provide the emitting field and source 52 can serve to focus or modulate the current arriving at anode 42.

Relating to FIGS. 3(*a*) and 3(*b*), in other embodiments, it may be desirable to include a resistive layer between the cathode row conductors (16, 40) and the microstructured layers (12, 38). Such resistive layers are known in the art, see for example, U.S. Pat. Nos. 4,940,916 and 5,507,676.

Also, in FIGS. 3(*a*) and 3(*b*), it is not shown but understood by those skilled in the art that the circuit includes suitable ballast resistors to limit the emission current so as not to burn up the microstructure tips.

The electrodes of the invention find utility in flat panel display technology, specifically gas plasma and field emission types, in vacuum tubes for microwave devices, and in other electron beam or ionization source devices.

Objects and advantages of this invention are further illustrated by the following examples, but the particular materials and amounts thereof recited in these examples, as well as other conditions and details, should not be construed to unduly limit this invention.

EXAMPLES

Vacuum Field Emission

Quantum field emission from a one-dimensional cold cathode emitter is described by the Fowler-Nordheim equation as discussed originally in R. B. Fowler, et al., Proc. R. Soc., London, Ser. A, 119 (1928) 173:

$$J = \frac{A(\beta E)^2}{\phi t^2(y)} \exp\left[-B\frac{\phi^{3/2}v(y)}{\beta E}\right] \qquad (1)$$

where J is in Amps/cm$^2$, E is the electric field strength in volts/cm, A=1.54×10$^{-6}$, B=6.87×10$^{7}$, y=3.79×10$^{-4}$ $(\beta E)^{1/2}/\phi$, $t^2(y)$~1.1 and $v(y)$~0.95−$y^2$. β is the field enhancement factor due to local geometry, and φ the work function in electron volts of the emitting material. Letting current I=Jα, where α is the emitting area in cm$^2$, and defining βE=β'V, equation (1) can be rewritten as:

$$\ln\left[\frac{I}{V^2}\right] = \ln\left[\alpha\frac{1.4(\beta')^2}{\phi\, 10^6}\right] + \frac{9.868}{\phi^{1/2}} - \frac{6.52\times 10^7}{\beta' V}\phi^{3/2} \qquad (2)$$

Plotting ln(I/V$^2$) vs. 1/V, a Fowler-Nordheim plot, should produce a straight line with a negative slope giving the field enhancement factor, β≈β'd, at a tip or field emission site, since V≈Ed, where d is the gap between the electrodes. β' is the field enhancement factor per unit of gap distance.

The microstructured layers used in the following examples were produced in a three-step process, as described in U.S. Pat. Nos. 4,812,352 and 5,039,561. First, an organic pigment, C.I. Pigment Red 149 (N,N'-di(3,5-xylyl)perylene-3,4:9,10-bis(dicarboximide)), available from American Hoechst-Celanese, Somerset, N.J., was vacuum vapor deposited to a thickness of approximately 0.15 micrometers onto an appropriate substrate, usually 50 μm (2 mil) thick metallized polyimide film, at a pressure less than 2×10$^{-6}$ Torr. Secondly, the perylene red coated polyimide was vacuum annealed at 240°–260° C. for approximately 30 minutes. The vacuum level during annealing was not critical and could vary as high as 5×10$^{-2}$ Torr. This annealing process caused the original smooth perylene red layer to undergo a phase transition to form a layer of discrete, oriented crystalline whiskers, each having approximately 0.05×approximately 0.03 micrometer cross-sections, lengths of approximately 2 micrometers, and areal number densities of approximately 30 whiskers per square micrometer. (The whisker growth mechanism and physical structure characteristics have been detailed in M. K. Debe and R. J. Poirier, *J. Vac. Sci. Technol.* A 12(4) (1994) 2017–2022, and M. K. Debe and A. R. Drube, *J. Vac. Sci. Technol.* B 13(3) (1995) 1236–1241.) As the third step, the microstructured layer was vacuum coated by evaporation, sputtering or other such process which applied a conformal sheath of metal or other suitable electron emissive material around each individual whisker. The geometric surface area of the whiskers was 10 to 15 times the planar area of the substrate, so the deposited planar-equivalent metal thickness was 10 to 15 times larger than the conformal thickness on the sides of each nanostructure element (coated whisker).

Instead of perylene red microstructures, there can be substituted other inorganic and organic compounds as have been disclosed in U.S. Pat. No. 5,336,558, which is incorporated herein by reference. Particularly useful are polynuclear aromatic hydrocarbons, e.g., naphthalenes, phenanthrenes, perylenes, phenyls, anthracenes, coronenes, and pyrenes.

The microstructured samples used in the following examples were not cleaned or pretreated in any way prior to the evaluations described. Examples 5–15 used a phosphor/gap/electrode construction similar to that in FIG. 3(*a*).

Example 1.

Figure 4:
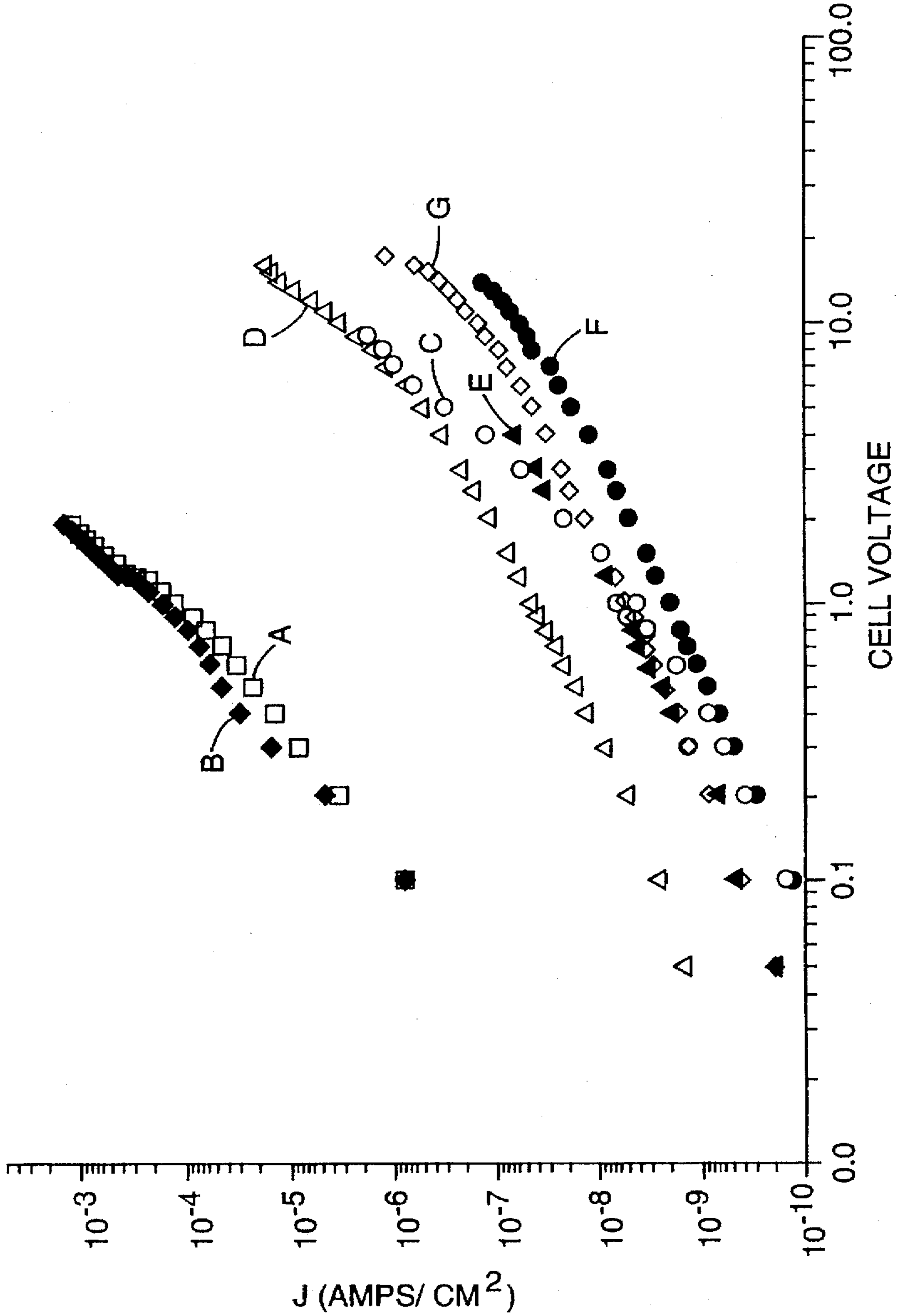
FIG. 4 shows a plot of ionization current versus voltage between spaced apart electrodes comprising microstructures coated onto metallized silicon substrates, as in Examples 1–3.

A perylene red microstructured layer was deposited onto standard 7.6 cm (3") diameter, polished Si wafers, previously coated with 70 nm (700 Å) of Pt. The whiskers, nominally 1.5 micrometers tall with cross-sectional dimensions and number densities described above, were conformally coated with a planar equivalent of 340 nm (3400 Å) of Pt. The microstructured side was spray coated with several approximately 1 second sprays of a 1 percent by weight dispersion of 20 micrometer diameter glass fibers in isopropanol. The function of the fibers was to act as a spacer to keep two cleaved pieces of the wafers spaced apart by the fiber diameter. Two 6.5 mm wide pieces of wafer were sandwiched perpendicular to each other with the whiskers facing the 20 gm gap. In air at ambient temperature and pressure, a voltage was applied to the Pt coated sides of each wafer piece and the current through the gap measured with a 1000 ohm ballast resistor in place to prevent excessive current levels. The voltage was varied between 0 and 2.0 volts, and the current recorded. FIG. 4, plots A and B, show the results for two sequential runs. The current densities are extremely large for such low voltages. These runs were typical of many numerous measurements, which generally were observed to eventually end in shorting between wafers when the voltages were applied for prolonged periods. The current was then limited by the ballast resistor. Evidence was obtained that the shorting was produced by "growth" of whiskers or clumps of whiskers bridging the gap. Plots A and B in FIG. 4 are therefore not representative of large area emission, but rather local emission from small numbers of the microstructured elements. Applying the voltage without the resistor would often burn away the short circuit and the process could be repeated.

Example 2.

Two new pieces of the Pt coated, microstructure covered Si wafers described in Example 1, each 1 cm wide by approximately 2 cm long, were placed perpendicular against each other so as to sandwich a 0.001-inch thick piece of polyimide at their intersection. The polyimide had a 6.5 mm×9.5 mm aperture cut in it, to expose the microstructures on each piece of wafer to the opposite piece at the intersection. Fine wires were attached by Ag paint to the microstructured side of each wafer piece, and the sample cell connected in series with a 103K ohm ballast resistor and a dc power supply. The sample was placed in a vacuum chamber and evacuated to approximately 35 mTorr. Voltage was applied to the Pt-coated sides of each wafer piece and the voltage developed by the emission current through the ballast resistor was measured with a digital voltmeter, as was the voltage developed just across the cell. The measured current density, amps/$cm^2$, is shown in FIG. 4 as plot C. The following day a second measurement was made, at a slightly lower pressure of 16 mTorr, plotted in FIG. 4 as plot D.

Example 3.

A second sandwich of the Pt coated whiskers on silicon wafer pieces was prepared as in Example 2 except the aperture in the 25 μm thick polyimide spacer was 5.2 mm×6.5 mm. The emission current density, measured as in Example 2, at a pressure of 6 mTorr, in a first run, is shown as plot E in FIG. 4. The sample was then brought to ambient pressure and plot F in FIG. 4 was generated from the data taken. The sample cell was then left overnight with 1 volt applied to it (approximately 16 hours) during which time the current was stable. Following this plot G in FIG. 4 was obtained. At the maximum of 17 volts (6,800 volts/cm), the cell shorted.

At ambient pressure the mean free path of air molecules is $6.7\times10^{-6}$ cm, or 0.067 microns, considerably smaller than the 20–25 μm gaps used in Examples 1–4. For plots C, D, and E in FIG. 4 taken at 35 mTorr or less for which the mean free path was 0.15 cm or larger and much larger than the gap, the pressure appeared to be too low for sustaining a gas discharge within the gap. The current versus voltage plots in FIG. 4 (below 10 volts at least) were not Fowler-Nordheim-like, but rather characterized by J varying in proportion to $V^3$, and most likely did not represent vacuum field emission. Replotting the data of plot D as ln $J/V^2$ vs. 1/V did suggest a Fowler-Nordheim relation for V>10 volts. The data of FIG. 4 below 10 volts (4000 volts/cm) show a gas phase ionization mechanism which was absent when the microstructures were excluded as in the comparative Example 4.

Example 4. Comparative

Two Pt coated Si wafer pieces, with no microstructure coatings on either piece, were formed into an otherwise identical sandwich to that of Example 3. It was mounted identically in the vacuum chamber and tested at 27 mTorr in the same way as the samples in Examples 2 and 3. The applied voltage was varied from 0 to 10, 15 and 20 volts, with no detectable current above the approximately $5\times10^{-11}$ ampere offset of the electrometer. The chamber was then backfilled to ambient pressure and the measurement repeated, to a maximum applied voltage of 50 volts. Again, no current was detectable above the noise level through a ballast resistor.

In Examples 5–15, vacuum field emission from samples of microstructured layers on polyimide substrates were imaged on a phosphor screen, in correlation with measurements of the emission current/voltage curves.

Example 5.

Figure 5A:
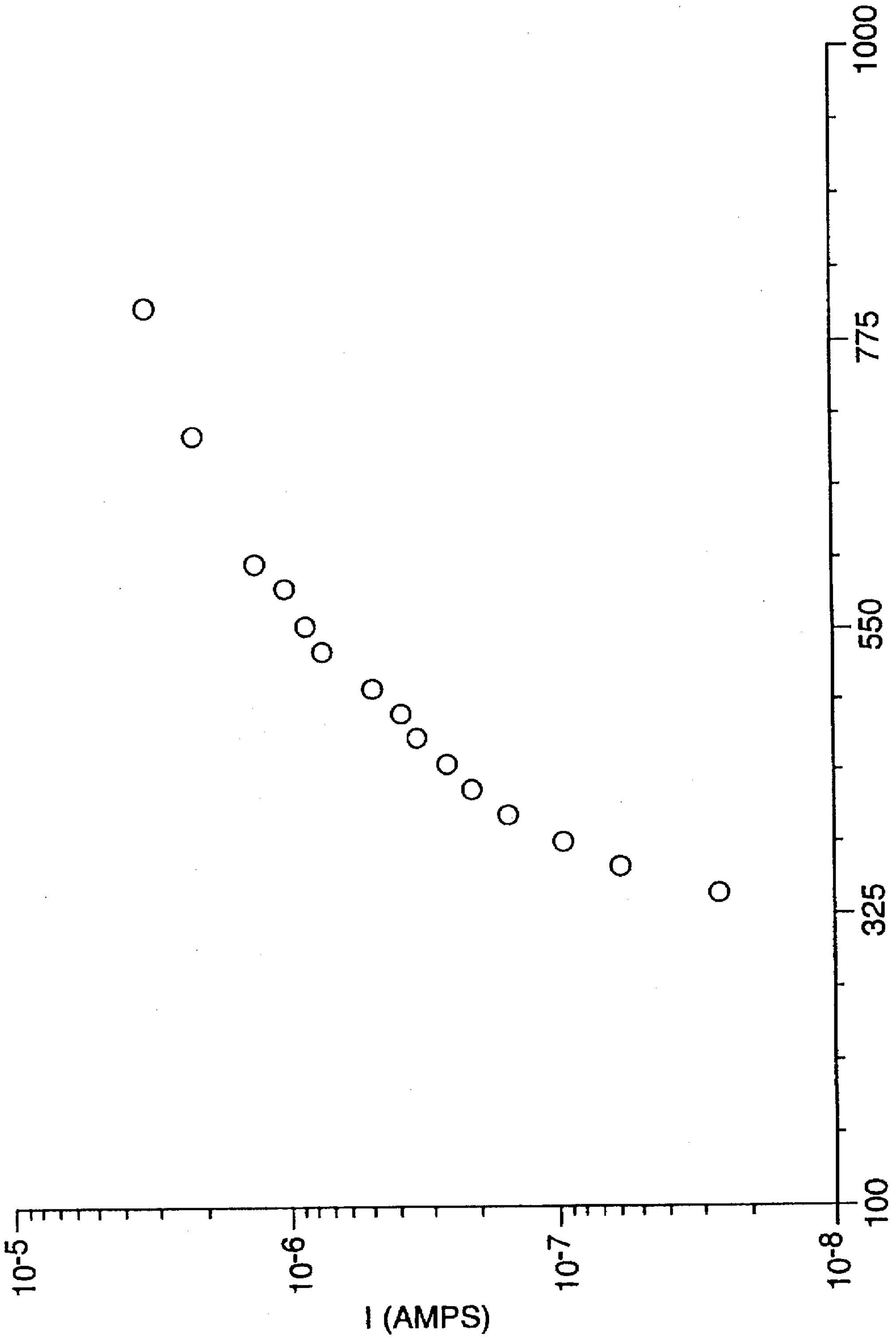
FIG. 5(*a*) shows a plot of field emission current versus voltage between an electrode comprising a microstructured layer and a phosphor screen, as in Example 5.
Figure 5B:
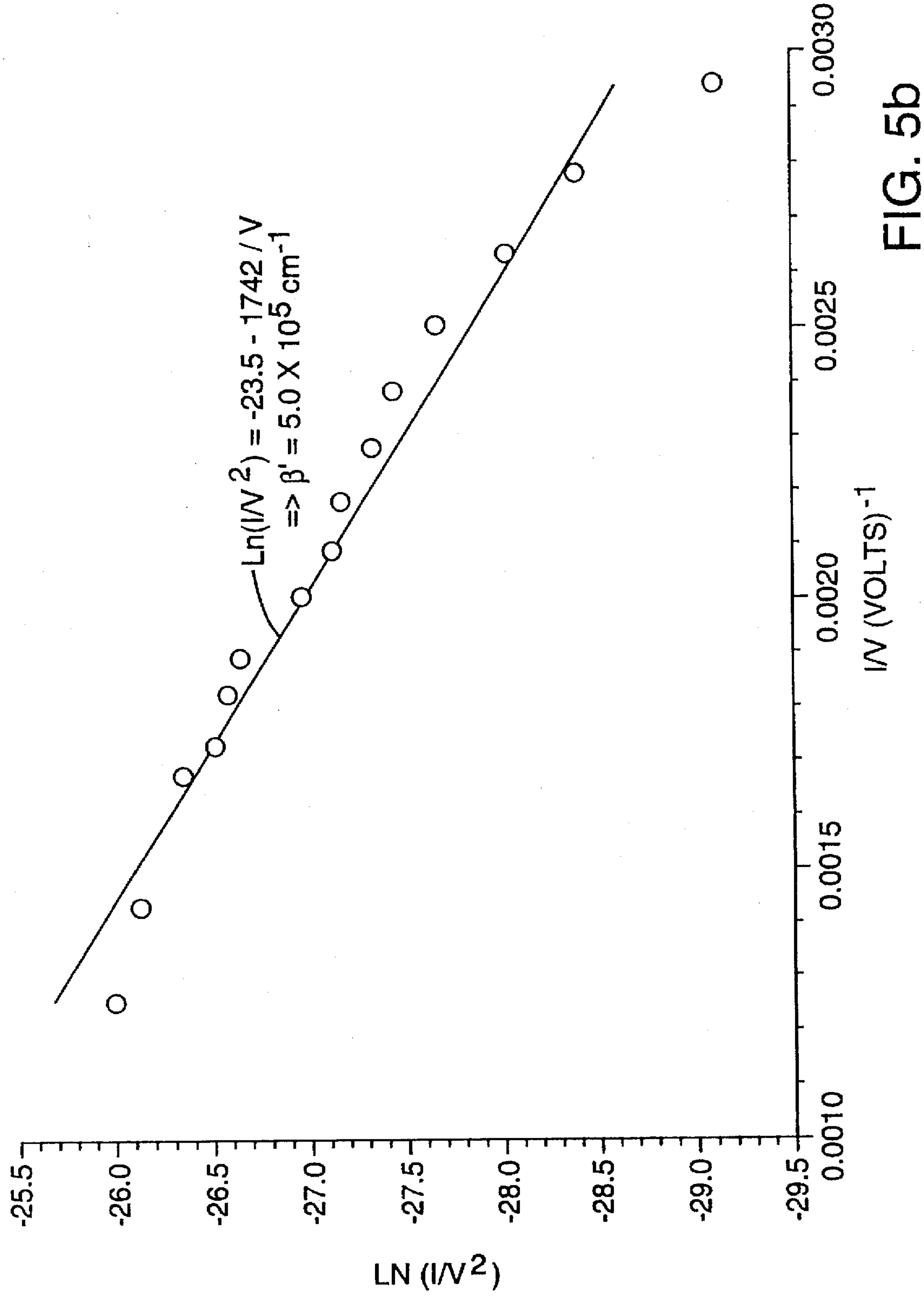

In this example, Pt/Ni coated whiskers (300 nm (3000 Å) of Ni, followed by 100 nm (1000 Å) of Pt e-beam deposited on nominally 1.5 μm tall PR149 whiskers as described in Example 1) formed a microstructured layer on a 50 μm thick polyimide substrate, precoated with 70 nm (700 Å) of Ni. A sample piece of the microstructured film was placed over a 12 mm×12 mm aperture in a 50 μm thick polyimide film spacer in contact with the phosphor of a commercial electron diffraction screen. The screen was a model 425-24 high energy electron diffraction (HEED) assembly, purchased from SPTC, Inc., Van Nuys, Calif. The phosphor was type P43, coated at 10 mg/$cm^2$ with 7–8 μm medium particle size. The total gap of the microstructure from the transparent conductive coating between the phosphor and its glass substrate was the phosphor thickness plus the polyimide spacer. The phosphor thickness was about 65 μm. The screen and cell assembly were placed in a vacuum chamber and evacuated to below 10 mTorr. A (−V) voltage was applied to the microstructured film side of the sample with respect to ground potential. A ballast resistor $R_b$=103K ohms was between ground and the metallic rim of the HEED screen. As the voltage applied to the microstructure exceeded approximately 600 volts, significant point flashes and discharges occurred in the exposed area of microstructure, due primarily, it is believed, to residual gas ionizations. Many of the local emission points were very stable, giving the aperture a "starry night" appearance. The bright points, many sufficiently bright to be seen even in room lights, were superimposed on a dim but uniform background illumination of the phosphor that could be seen in a well darkened room. The intensity of the background illumination varied directly with the applied voltage between 500 and 800 volts, being only barely detectable at 500 volts. The illuminated aperture area was observed for over 15 minutes and then the current through $R_b$ was measured as a function of V. FIG. 5(*a*) shows a plot of this measured current as a function of the cell voltage, and FIG. 5(*b*) shows a plot of the same data in a Fowler-Nordheim plot as defined in equation (2). The solid line through the plotted points of FIG. 5(*b*) is a linear curve fit of equation (2) to the data with the work function $\phi$=5.6 eV for Pt. The slope of the linear curve-fitted plot in FIG. 5(*b*) gives a value for β', defined in equation (2), of $5\times10^5$ $cm^{-1}$. The field enhancement factor, β, is related to β', and the gap distance d over which the electric field is applied, as β≈β'd, as discussed following equation (2). Depending on the dielectric properties of the phosphor, this gap distance can vary from a minimum equal to the thickness of the polyimide spacer, to a maximum of the spacer-plus-phosphor thickness. In this example this range was 51 μm<d<114 μm. This indicated the range for the field enhancement factor was approximately 2500<β<5700.

The threshold voltage, $V^{th}$, i.e., where emission current first starts to rapidly become measurable, and the gap spacing, d, define the emission threshold, $g=V^{th}/d$. From FIG. 5(*a*) $V^{th}$ is ≈325 volts, which with the above range for d implies an emission threshold in the range of 2.85 volts/μm<g<6.5 volts/μm.

The polarity of the voltage applied between the microstructured layer and the phosphor was then reversed, i.e., up to (+) 800 volts was applied to the microstructured layer with respect to the phosphor screen. No emission current nor light emission from the screen was observed, consistent with the diode behavior of electron field emission.

Example 6.

Figure 6A:
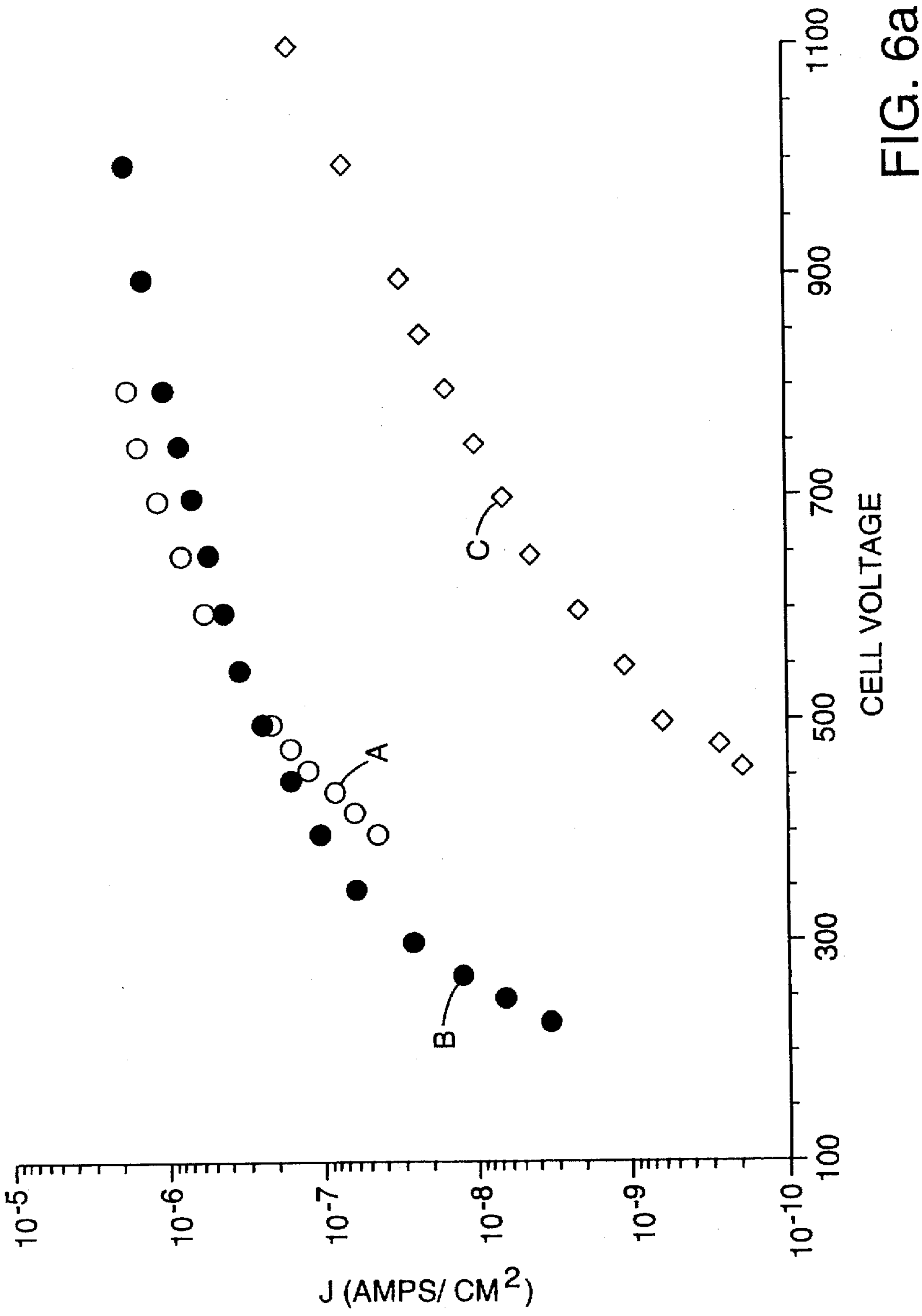
FIG. 6(*a*) shows field emission current density versus cell voltage from a microstructured layer to a phosphor screen for three electrodes comprising microstructured layers, as in Examples 6–8.
Figure 6B:
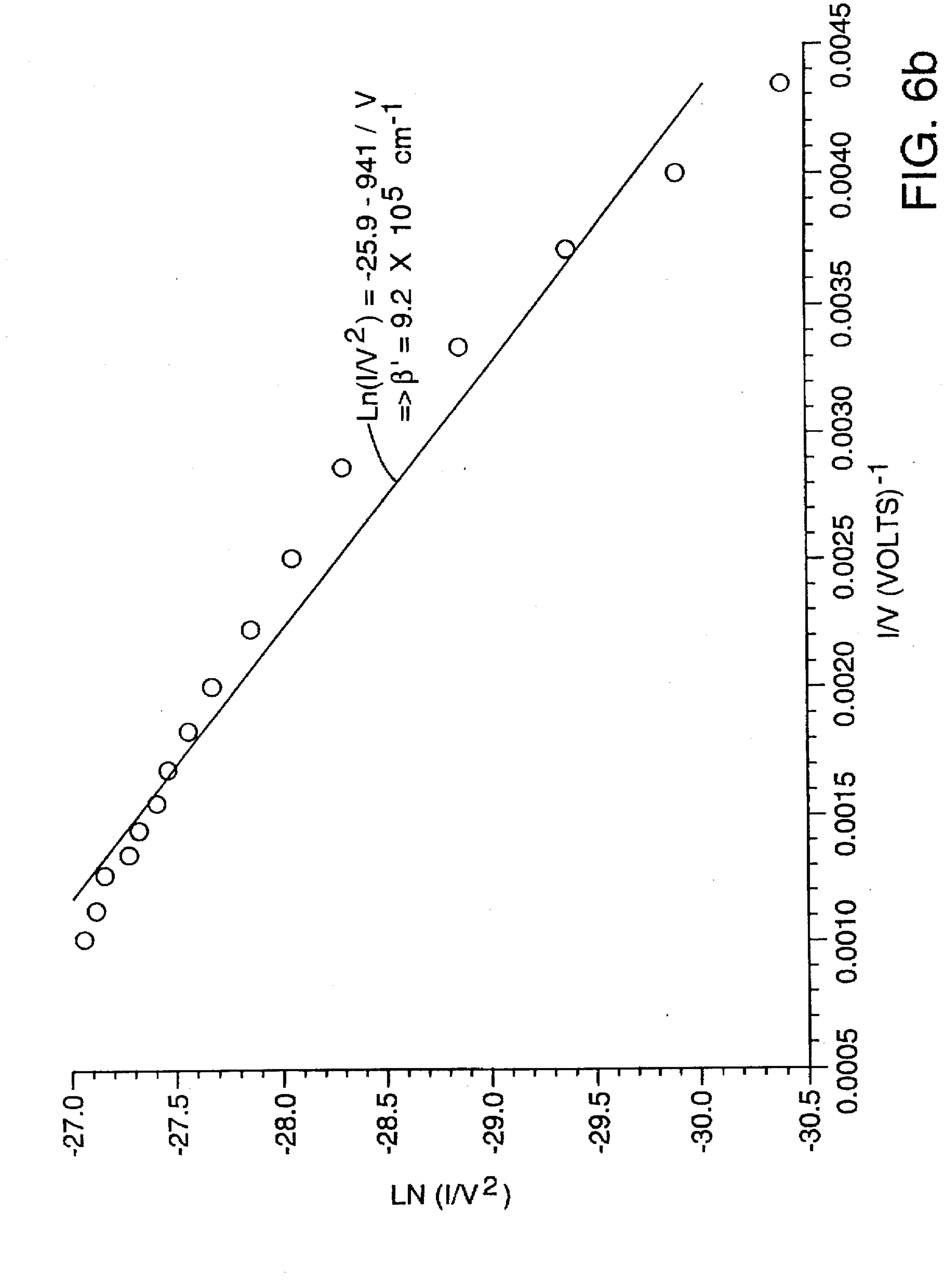

A test cell similar to that in Example 5 was assembled using a 25 μm thick polyimide spacer and microstructured film of the same perylene red whisker sizes but having 440 nm (4400 Å) mass equivalent of Pt coated onto the whiskers. The current density voltage was measured at a pressure of 6 mTorr, and is shown in FIG. 6(*a*) as plot A. A similar emission pattern was seen on the phosphor screen as Example 5.

Example 7.

A test cell similar to that in Example 6 was assembled, with a 25 μm thick polyimide film spacer and 340 nm (3400 Å) of Pt coated on perylene red whiskers approximately 2 μm in length compared to the approximately 1.5 μm whiskers of the previous examples. It was evaluated at $2\times10^{-5}$ Torr. This sample also produced a visible illumination of the screen in the apertured area of the nanostructure. As with previous samples, at higher pressures, the cell current fluctuated due to bright flashes still occurring. However, it stabilized sufficiently so readings of the emission current could be taken whenever the flashes were absent, corresponding to the minimum value observed at any applied voltage. This current is believed representative of the uniform screen illumination over the approximately 1 $cm^2$ area exposed. Plot I in FIG. 6(*a*) shows the current density measured, and FIG. 6(*b*) is a Fowler-Nordheim plot of the same data. The slope of the linear curve-fitted plot in FIG. 6(*b*) gives a value for β', defined in equation (2), of $9.2\times10^5$ $cm^-$. As above, the field enhancement factor, β, is related to β', and the gap distance d over which the electric field is applied, as β≈β'd. Again, this gap distance varied from a minimum equal to the thickness of the polyimide spacer, to a maximum of the spacer-plus-phosphor thickness, or 25 μm<d<89 μm. This showed the range for the field enhancement factor was approximately 2300<β<8100.

The threshold voltage, $V^{th}$, i.e., where emission current first started to rapidly become measurable, appears for plot B in FIG. 6(*a*) $V^{th}$ to be ~200 volts, which with the above range for d showed an emission threshold in the range of 2.25 volts/μm<g<8.0 volts/μm.

Example 8.

A test cell similar to that in Example 6 was assembled, with a 50 μm thick polyimide spacer, and an 8.5 mm×8.5 mm aperture to expose the microstructured layer to the HEED screen. The microstructure sample in this example had 150 nm (1500 Å) of gold coated on whiskers 1.5 μm tall as shown by SEM micrographs. The measured current per unit aperture area is shown as a function of applied voltage in FIG. 6(*a*) as plot C.

Example 9. Tip Conditioning

This example shows how the emission over a large area can be stabilized by "conditioning" the microstructure emission sites by operation initially at higher pressure. It was observed for many samples.

A test cell was assembled, with a 4 mm×14 mm aperture in a 25 μm polyimide spacer, placed between the HEED screen phosphor and a sample of the Pt/Ni coated whiskers used in Example 5. Application of voltages between 500–1000 volts at pressures below $10^{-5}$ Torr produced multiple localized high intensity point flashes over the aperture area, most of which were transitory. There was no significant uniform background illumination of the aperture area, due to the emission current being preferentially emitted from the localized spots. The intensity from the brightest spots was adequate to be seen on the screen in room light conditions. This behavior was stable over long periods (e.g., 30 minutes). The pressure was increased to 3 mTorr with 900 volts applied. The localized transitory flashes were replaced by a uniformly glowing aperture area, visible in a well-darkened room. The pressure was dropped again to below $10^{-5}$ Torr and the image remained stable. Occasionally a sustained bright, localized emission spot would occur, which had the effect of reducing the background brightness of the whole aperture area as emission occurred preferentially from the localized spot. Reducing the voltage and quickly reapplying it broke the localized point emission and returned intensity to the whole phosphor screen aperture area. At 1000 volts applied to the cell the uniform background illumination corresponded to a total current of $10^{-8}$ amps. Operation at elevated pressures, for example at 1 mTorr for a sufficient time (e.g., several minutes) produced a uniform electron emitting surface.

Example 10. Comparative

An electrode sample with no microstructure, a piece of Cu sputter-coated 50 μm thick polyimide, was placed over the same 25 μm polyimide spacer used in Example 9, facing the HEED screen. It was evaluated in the same manner as previous samples. No sustained point emission or uniform background illumination of the aperture area was seen. With 1000 volts applied across the gap, the current through the ballast resistor was on the order of the baseline noise level of $10^{-10}$ amps.

Example 11.

Figure 7:
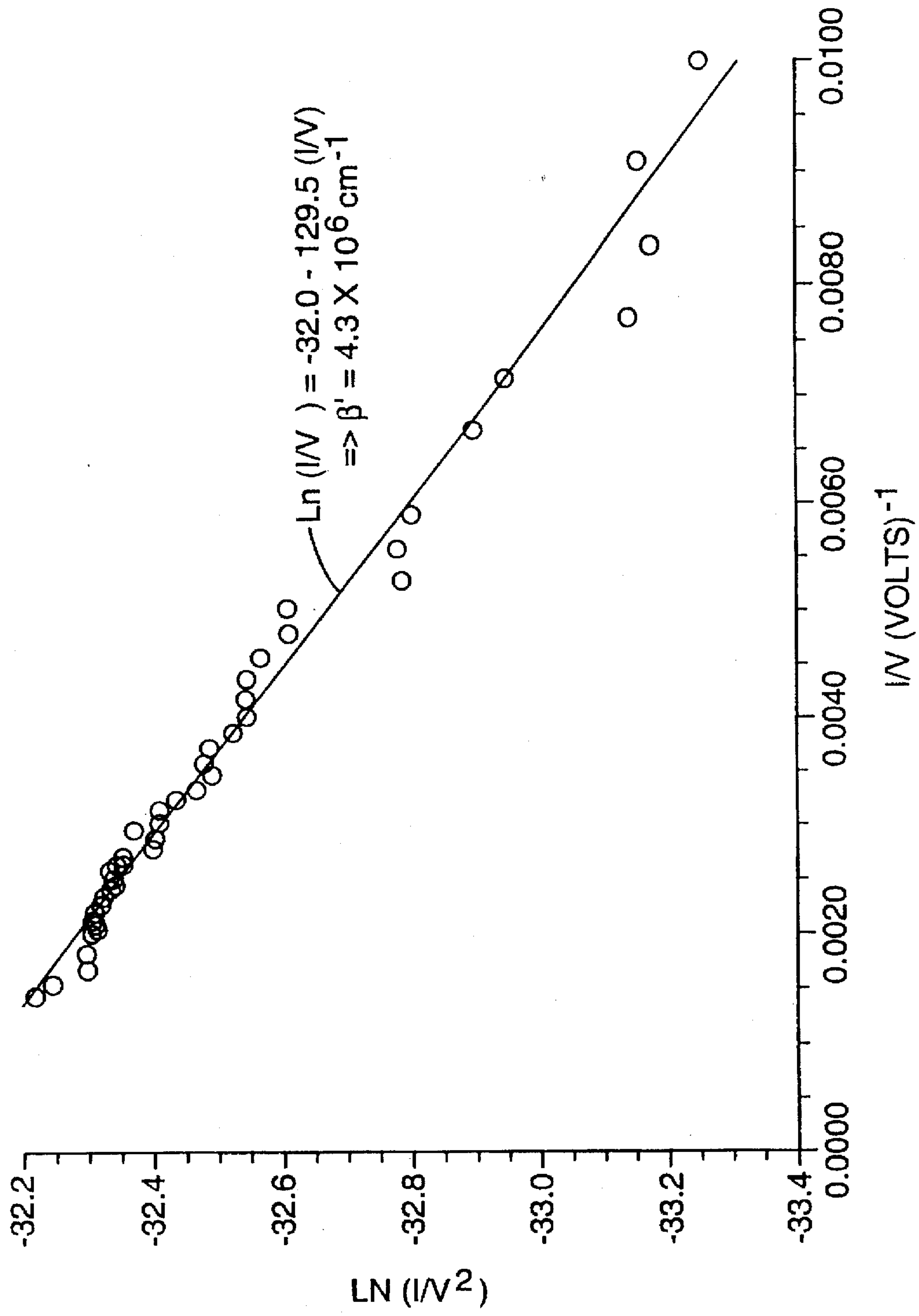
FIG. 7 shows a Fowler-Nordheim plot of field emission current from an electrode comprising a cobalt-coated microstructured layer, as in Example 11.

A test cell similar to that in Example 7, with a 25 μm polyimide spacer, was evaluated using a sample of microstructured PR149 whiskers of the same size as in Example 1, but having 200 nm mass equivalent thickness of sputter deposited cobalt applied as the conformal coating. The emission current was particularly stable with a very low threshold voltage of approximately 100 volts. The Fowler-Nordheim plot of this emission current is shown in FIG. 7. The slope of the linear curve-fitted plot in FIG. 7 using a work function for cobalt ϕ=4.18 eV, gives a value for β', defined in equation (2), of $4.3\times10^6$ $cm^{-1}$. As above, the field enhancement factor, β, is related to β' and the gap distance d over which the electric field is applied, as β≈β'd. Again, this gap distance varied from a minimum equal to the thickness of the polyimide spacer, to a maximum of the spacer-plus-phosphor thickness, or 25 μm<d<89 μm. This showed the range for the field enhancement factor was approximately 11,000<β<38,000. The range for the emission threshold was approximately 1.13 volts/μm<g<4.0 volts/μm.

Example 12.

A test cell similar to that in Example 7, with a 25 μm polyimide spacer, was evaluated using a sample of microstructured PR149 whiskers of the same size as in Example 1, except the PR149 had been deposited onto a Ag coated polyimide substrate and a thin conformal coating of diamond-like carbon (DLC) was applied with a cathodic arc vacuum process as disclosed in U.S. Pat. No. 5,401,543, Example 1. Thermal effects of the DLC coating process caused the PR149 microstructures to become curvalinear, as shown in FIG. 8, a 10,000 X scanning electron micrograph of a DLC coated microstructure layer. The exact planar equivalent thickness of the DLC coating was not measured, but judging from the cross-sectional thickness of the microstructures in FIG. 8 and higher magnifications, an approximate planar equivalent thickness of 400–500 nm is estimated. The vacuum field emission was observed to be similar to the metal coated whiskers of Examples 5–9 and 11, producing, e.g., current densities on the order of 1 microamp/$cm^2$ with a potential of 1000 volts applied between the sample and the phosphor screen. The DLC coated microstructures appeared to be more robust, and not damaged by the localized residual gas discharges as were the metal coated whiskers. It is believed the carbon coating facilitated or enhanced the adhesion of microstructured elements to the substrate and made them less susceptible to removal by electrostatic force.

Examples 13–15.

Similar cells to those in Examples 5–12 were evaluated with the phosphor screen, 25 μm polyimide spacers, and microstructured films coated according to the process of Example 1 with Pd, Ag, and Cu. Similar results were observed as in previous examples.

Various modifications and alterations of this invention will become apparent to those skilled in the art without departing from the scope and spirit of this invention, and it should be understood that this invention is not to be unduly limited to the illustrative embodiments set forth herein.

I claim:

1. An electron field emission display comprising an electrode including as cathode a layer comprising a dense array of discrete solid microstructures disposed on at least a portion of one or more surfaces of a substrate, said microstructures having an areal number density of greater than $10^7/cm^2$, at least a portion of said microstructures being conformally overcoated with one or more layers of an electron emitting material, said overcoated electron emitting material being disposed on at least a portion of each of said microstructures and having a surface morphology that is nanoscopically rough and that provides multiple potential field emission sites per microstructure.

2. The display according to claim 1 wherein said microstructures have an areal density greater than $10^8/cm^2$.

3. The display according to claim 1 wherein said dense array of said microstructures of said electrode are randomly oriented.

4. The display according to claim 1 wherein said microstructures of said electrode are at least one of regularly and randomly arrayed.

5. The display according to claim 1 wherein said dense array of said micro structures of said electrode are oriented such that their major axes are parallel to each other.

6. The display according to claim 1 wherein said microstructures of said electrode are essentially non-uniform in size and shape.

7. The display according to claim 1 wherein said microstructures of said electrode are essentially uniform in size and shape.

8. The display according to claim 1 wherein said microstructures of said electrode have an average cross-sectional dimension in the range of 0.01 to 0.5 micrometer.

9. The display according to claim 1 wherein said microstructures of said electrode have average lengths of 0.1 to 5 micrometers.

10. The display according to claim 1 wherein said microstructures of said electrode have an aspect ratio which ranges from about 1:1 to about 100:1.

11. The display according to claim 1 wherein said microstructures of said electrode comprise an organic material comprising planar molecules and chains or rings over which π-electron density is delocalized.

12. The display according to claim 1 wherein said microstructures comprise an organic material selected from the group consisting of polynuclear aromatic hydrocarbons and heterocyclic aromatic compounds.

13. The display according to claim 12 wherein said polynuclear aromatic hydrocarbons are selected from the group consisting of naphthalenes, phenanthrenes, perylenes, anthracenes, coronenes, and pyrenes.

14. The display according to claim 12 wherein said heterocyclic aromatic compounds are selected from the group consisting of phthalocyanines, porphyrins, carbazoles, purines, and pterins.

15. The display according to claim 11 wherein said organic material is N,N'-di(3,5-xylyl)perylene-3,4,9,10-bis (dicarboximide).

16. The display according to claim 1 wherein said microstructures are semiconductors made from a material selected from the group consisting of diamond, germanium, selenium, arsenic, silicon, tellurium, gallium arsenide, gallium antimonide, gallium phosphide, aluminum antimonide, indium antimonide, indium tin oxide, zinc antimonide, indium phosphide, aluminum gallium arsenide, zinc telluride, and combinations thereof.

17. The display according to claim 1 wherein said microstructures of said electrode comprise a polymeric material.

18. The display according to claim 1 wherein said microstructures of said electrode form at least one of a repeating or nonrepeating pattern.

19. The display according to claim 1 wherein said microstructures are uniformly oriented and are perpendicular to said surface of said substrate.

20. The display according to claim 1 wherein said microstructures are patterned.

21. The display according to claim 20 which is patterned by means selected from the group consisting of radiation ablation, photolithography, mechanical process, vacuum process, chemical process, and gas pressure or fluid process.

22. The display according to claim 1 wherein said conformal coating of said microstructures of said electrode comprises a material selected from the group consisting of an organic material and an inorganic material.

23. The display according to claim 22 wherein said inorganic material is selected from the group consisting of metals, carbon, metal oxides, metal sulfides, metal chlorides, metal carbides, metal borides, metal nitrides, and metal silicides.

24. The display according to claim 23 wherein said inorganic material is diamond-like carbon.

25. The display according to claim 23 wherein said inorganic material is a metal.

26. The display according to claim 22 wherein said inorganic conformal coating is a vacuum gettering material.

27. The display according to claim 1 wherein said overcoated microstructures have low electronic work functions in the range of greater than zero and up to 6 eV.

28. The display according to claim 1 wherein said substrate is selected from the group consisting of organic and inorganic materials.

29. The display according to claim 28 wherein said organic material is a polymer.

30. The display according to claim 28 wherein said substrate is selected from the group consisting of glasses, ceramics, metals, and semi-conductors.

31. The display according to claim 30 wherein said substrate is glass or metal.

32. A method of preparing an electrode for a field emission display comprising the steps of:

providing a substrate bearing on one or more surfaces thereof a microlayer comprising a dense array of discrete, solid microstructures, said microstructures having an areal number density of greater than $10^7$/cm$^2$, and individually conformally overcoating at least a portion of said microstructures with one or more electron emissive materials in an amount in the range of 10 to 1000 nm planar equivalent thickness, said overcoating layer having a surface morphology that is nanoscopically rough.

33. The method according to claim 32 further comprising the step of conditioning the electrode by subjecting it to elevated pressure for a time sufficient to produce a uniform electron emitting surface.

34. An electric field producing structure comprises first and second conductive electrodes insulatingly spaced from and substantially parallel to each other, the first conductive electrode comprising a layer having a dense array of discrete solid microstructures disposed on at least a portion of one or more surfaces of a substrate, the microstructures having an areal number density of greater than $10^7$/cm$^2$, the microstructures individually being conformally overcoated with one or more nanolayers of an electron emitting material, the overcoated electron emitting material being disposed on at least a portion of the microstructures and having a surface morphology that is nanoscopically rough.

35. The electric field producing structure according to claim 34 which is useful in a microwave device.

* * * * *